US012648222B2

(12) United States Patent
Shih et al.

(10) Patent No.: US 12,648,222 B2
(45) Date of Patent: Jun. 2, 2026

(54) GATE PATTERNING FOR STACKED DEVICE STRUCTURE USING SELF-ASSEMBLED MONOLAYER

(71) Applicant: Taiwan Semiconductor Manufacturing Company, Ltd., Hsinchu (TW)

(72) Inventors: Che Chi Shih, Taoyuan City (TW); TsungKai Chiu, Hsinchu County (TW); Ku-Feng Yang, Hsinchu County (TW); Szuya Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 416 days.

(21) Appl. No.: 18/459,952

(22) Filed: Sep. 1, 2023

(65) Prior Publication Data

US 2024/0312846 A1     Sep. 19, 2024

Related U.S. Application Data

(60) Provisional application No. 63/490,799, filed on Mar. 17, 2023.

(51) Int. Cl.
H10D 86/01          (2025.01)
H10D 84/01          (2025.01)
(Continued)

(52) U.S. Cl.
CPC .......... *H10D 86/01* (2025.01); *H10D 84/038* (2025.01); *H10D 87/00* (2025.01); *H10D 88/01* (2025.01);
(Continued)

(58) Field of Classification Search
CPC .......... H01L 21/02603; H10D 84/0167; H10D 84/0128; H10D 84/8311; H10D 84/0144;
(Continued)

(56) References Cited

U.S. PATENT DOCUMENTS 8,748,940 B1 *   6/2014   Rachmady ......... H10D 30/6757
                                                  257/190
9,214,555 B2 *  12/2015   Oxland ................ H10D 30/024
(Continued)

*Primary Examiner* — Sophia T Nguyen
(74) *Attorney, Agent, or Firm* — HAYNES AND BOONE, LLP

(57) ABSTRACT

Methods of forming gate structures for stacked multi-gate devices are provided. A method according to the present disclosure includes forming a gate dielectric layer to wrap around a bottom channel member and a top channel member, depositing a dipole layer over the gate dielectric layer, forming a dummy layer such that the top channel member is disposed above the top surface of the dummy layer, removing the dipole layer around the top channel member, forming a self-assembled monolayer (SAM) on the top surface of the dummy layer, depositing a hard mask layer to wrap over the top channel member, removing the SAM and the dummy layer, performing a thermal drive-in process to drive a dipole dopant species from the dipole layer into the gate dielectric layer around the bottom channel member, removing the hard mask layer, and removing the dipole layer.

20 Claims, 27 Drawing Sheets

200

(51) Int. Cl.
  *H10D 84/03* (2025.01)
  *H10D 87/00* (2025.01)
  *H10D 88/00* (2025.01)
(52) U.S. Cl.
  CPC ....... *H10D 84/017* (2025.01); *H10D 84/0177* (2025.01); *H10D 84/0179* (2025.01); *H10D 84/0181* (2025.01); *H10D 84/0188* (2025.01)
(58) Field of Classification Search
  CPC .. H10D 84/0181; H10D 84/856; H10D 88/01; H10D 62/121; H10D 62/292; H10D 30/6735; H10D 30/6757; H10D 30/014; H10D 30/43; H10D 30/501; H10D 30/019; H10D 30/502; H10D 30/503; H10D 30/504; H10D 30/506; H10D 30/0191; H10D 30/0193; H10D 30/0194; H10D 30/0195; H10D 30/0196; H10D 30/0197
  See application file for complete search history.

(56) References Cited

U.S. PATENT DOCUMENTS

| | | | | |
|---|---|---|---|---|
| 9,224,811 | B2 * | 12/2015 | Cheng | H10D 62/8164 |
| 9,899,387 | B2 * | 2/2018 | Ching | H10D 84/0179 |
| 9,935,014 | B1 * | 4/2018 | Cheng | H10D 84/0144 |
| 10,121,826 | B1 * | 11/2018 | Chen | H10D 30/014 |
| 10,340,340 | B2 * | 7/2019 | Bao | B82Y 10/00 |
| 10,475,935 | B2 * | 11/2019 | Zhu | B82Y 10/00 |
| 10,685,887 | B2 * | 6/2020 | Smith | H10D 84/856 |
| 10,741,558 | B2 * | 8/2020 | Chiang | H10D 30/0243 |
| 10,790,280 | B2 * | 9/2020 | Ching | H10D 30/62 |
| 10,879,308 | B1 * | 12/2020 | Ando | H01L 21/02532 |
| 11,043,493 | B2 * | 6/2021 | Bi | H10D 84/85 |
| 11,152,477 | B2 * | 10/2021 | Chu | H10D 84/834 |
| 11,158,544 | B2 * | 10/2021 | Cheng | H10D 62/121 |
| 11,374,088 | B2 * | 6/2022 | Liaw | H10D 62/112 |
| 11,393,813 | B2 * | 7/2022 | Gardner | H10D 84/85 |
| 11,502,199 | B2 * | 11/2022 | Yang | H10D 30/43 |
| 11,532,627 | B2 | 12/2022 | Liao | |
| 11,699,760 | B2 | 7/2023 | Lin | |
| 11,735,669 | B2 | 8/2023 | Chuang | |
| 11,854,905 | B2 * | 12/2023 | Ng | H10D 84/85 |
| 11,894,373 | B2 * | 2/2024 | Yang | H10D 84/0149 |
| 11,908,892 | B2 * | 2/2024 | Ye | H10D 30/014 |
| 12,136,656 | B2 * | 11/2024 | Gaul | H10D 30/021 |
| 12,176,416 | B2 * | 12/2024 | Yu | H10D 30/6757 |
| 12,218,133 | B2 * | 2/2025 | Park | H10D 30/031 |
| 2013/0341704 | A1 * | 12/2013 | Rachmady | H01L 21/02603 |
| | | | | 977/890 |
| 2014/0175379 | A1 * | 6/2014 | Chu-Kung | H10D 62/822 |
| | | | | 257/20 |
| 2014/0175515 | A1 * | 6/2014 | Then | H10D 62/405 |
| | | | | 438/168 |
| 2015/0372145 | A1 * | 12/2015 | Cheng | H10D 30/6212 |
| | | | | 257/288 |
| 2016/0276484 | A1 * | 9/2016 | Kim | H01L 21/30604 |
| 2017/0005195 | A1 * | 1/2017 | Ching | H10D 62/115 |
| 2017/0025314 | A1 * | 1/2017 | Witters | H10D 30/025 |
| 2017/0040321 | A1 * | 2/2017 | Mitard | B82Y 10/00 |

| | | | | |
|---|---|---|---|---|
| 2017/0256615 | A1 * | 9/2017 | Chen | H10D 84/83 |
| 2018/0308986 | A1 * | 10/2018 | Chao | H10D 30/43 |
| 2018/0358467 | A1 * | 12/2018 | Kim | H10D 30/6211 |
| 2019/0131394 | A1 * | 5/2019 | Reznicek | H10D 30/6739 |
| 2019/0196830 | A1 * | 6/2019 | Lilak | H10D 30/014 |
| 2019/0221483 | A1 * | 7/2019 | Mulfinger | H10D 62/116 |
| 2020/0044028 | A1 * | 2/2020 | Reznicek | H10D 62/221 |
| 2020/0058653 | A1 * | 2/2020 | Chiang | H01L 21/28088 |
| 2020/0105751 | A1 * | 4/2020 | Dewey | H10D 62/235 |
| 2020/0118891 | A1 * | 4/2020 | Cheng | B82Y 10/00 |
| 2020/0219979 | A1 * | 7/2020 | Rachmady | B82Y 10/00 |
| 2020/0241149 | A1 * | 7/2020 | Yau | H10D 30/6755 |
| 2020/0266218 | A1 * | 8/2020 | Lilak | H10D 30/014 |
| 2020/0294969 | A1 * | 9/2020 | Rachmady | H10D 30/62 |
| 2020/0295127 | A1 * | 9/2020 | Mannebach | H10D 30/6211 |
| 2020/0373334 | A1 * | 11/2020 | Huang | H10D 30/6757 |
| 2021/0005604 | A1 * | 1/2021 | Ge | H10D 84/0167 |
| 2021/0193654 | A1 * | 6/2021 | Park | H10D 30/014 |
| 2021/0210388 | A1 * | 7/2021 | Zhang | H10D 30/6757 |
| 2022/0037499 | A1 * | 2/2022 | Chu | H01L 21/28088 |
| 2022/0157936 | A1 * | 5/2022 | Khaderbad | H10D 30/024 |
| 2022/0165731 | A1 * | 5/2022 | Huang | H10D 84/0167 |
| 2022/0199620 | A1 * | 6/2022 | Thomas | H10D 64/691 |
| 2022/0216340 | A1 * | 7/2022 | Lin | H10D 84/013 |
| 2022/0344354 | A1 * | 10/2022 | Lin | H10D 84/038 |
| 2022/0416048 | A1 * | 12/2022 | Smith | H10D 30/6757 |
| 2023/0086084 | A1 * | 3/2023 | Yun | H10D 30/43 |
| | | | | 257/401 |
| 2023/0138121 | A1 * | 5/2023 | Park | H10D 88/00 |
| | | | | 257/351 |
| 2023/0146060 | A1 * | 5/2023 | Park | H10D 88/00 |
| | | | | 257/324 |
| 2023/0163127 | A1 * | 5/2023 | Wu | H10D 84/038 |
| | | | | 257/351 |
| 2023/0178544 | A1 * | 6/2023 | Frougier | H10D 30/6735 |
| | | | | 257/399 |
| 2023/0197728 | A1 * | 6/2023 | Thomas | H10D 62/121 |
| | | | | 257/365 |
| 2023/0197830 | A1 * | 6/2023 | Chan | H10D 64/01 |
| | | | | 438/199 |
| 2023/0307456 | A1 * | 9/2023 | Lin | H10D 30/6735 |
| 2023/0326971 | A1 * | 10/2023 | Hwang | H10D 84/83 |
| 2024/0014282 | A1 * | 1/2024 | Hu | H01L 21/28088 |
| 2024/0290630 | A1 * | 8/2024 | Lai | H10D 30/43 |
| 2024/0312846 | A1 * | 9/2024 | Shih | H10D 88/01 |
| 2024/0321640 | A1 * | 9/2024 | Chen | H10D 62/364 |
| 2025/0006816 | A1 * | 1/2025 | Lin | H10D 84/017 |
| 2025/0014947 | A1 * | 1/2025 | Sano | H10D 62/121 |
| 2025/0056832 | A1 * | 2/2025 | Lee | H01L 21/28079 |
| 2025/0089355 | A1 * | 3/2025 | Lin | H10D 84/85 |
| 2025/0089360 | A1 * | 3/2025 | Lien | H10D 86/0214 |
| 2025/0095997 | A1 * | 3/2025 | Yang | H10D 84/038 |
| 2025/0113604 | A1 * | 4/2025 | Sano | H01L 21/28185 |
| 2025/0126885 | A1 * | 4/2025 | Seol | H10D 30/6757 |
| 2025/0151367 | A1 * | 5/2025 | Yang | H10D 30/014 |
| 2025/0151387 | A1 * | 5/2025 | Lin | H10D 84/0167 |
| 2025/0261396 | A1 * | 8/2025 | Jeon | H10D 30/43 |
| 2025/0267915 | A1 * | 8/2025 | Liu | H10D 84/0193 |
| 2025/0311428 | A1 * | 10/2025 | Xu | H10D 86/60 |
| 2025/0351450 | A1 * | 11/2025 | Hu | H10D 88/01 |
| 2025/0351547 | A1 * | 11/2025 | Chen | H10D 30/6735 |
| 2025/0359287 | A1 * | 11/2025 | Sano | H10D 30/6735 |
| 2025/0359329 | A1 * | 11/2025 | Shih | H10D 30/6757 |

* cited by examiner

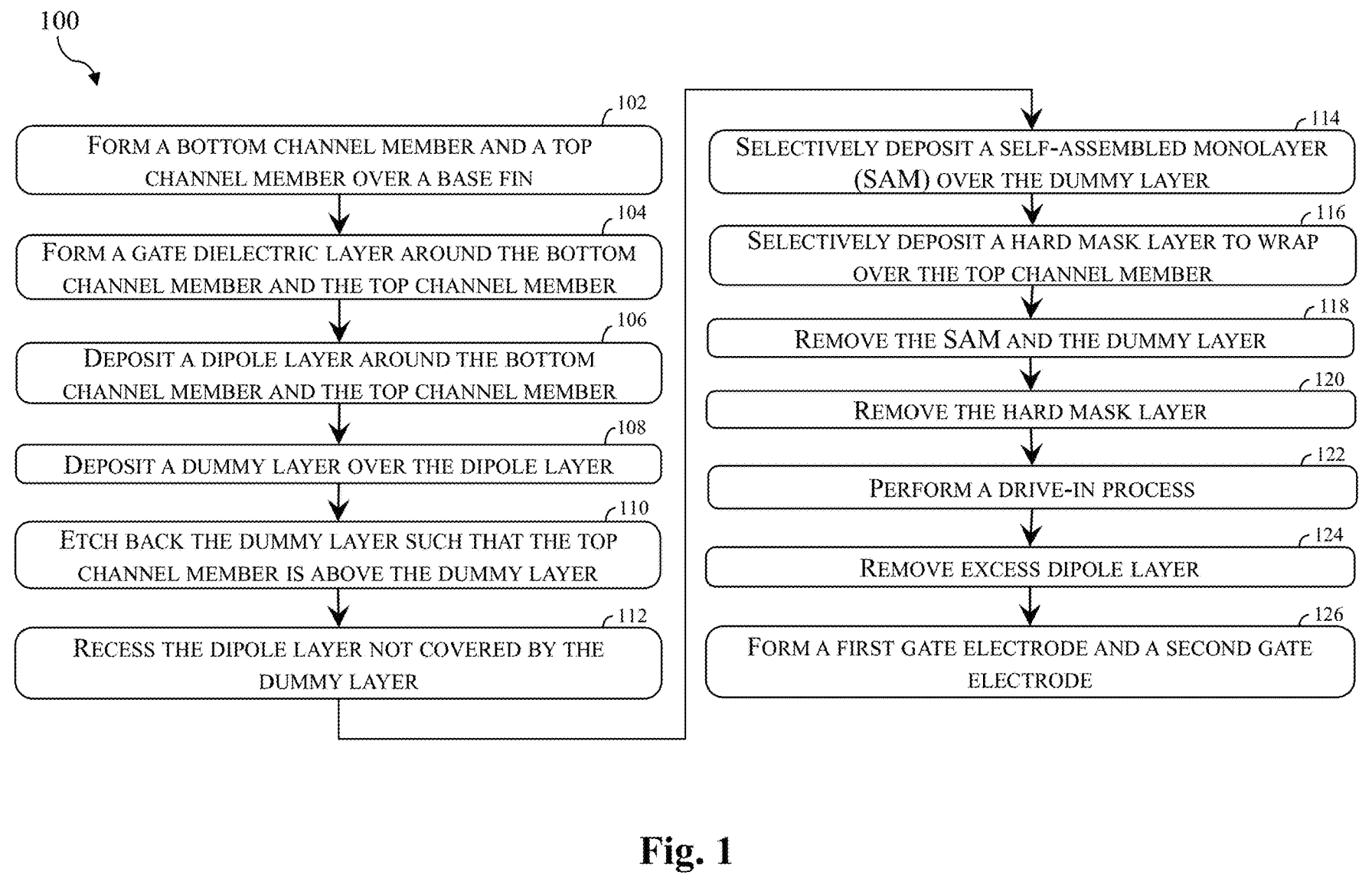

100

102 — FORM A BOTTOM CHANNEL MEMBER AND A TOP CHANNEL MEMBER OVER A BASE FIN

104 — FORM A GATE DIELECTRIC LAYER AROUND THE BOTTOM CHANNEL MEMBER AND THE TOP CHANNEL MEMBER

106 — DEPOSIT A DIPOLE LAYER AROUND THE BOTTOM CHANNEL MEMBER AND THE TOP CHANNEL MEMBER

108 — DEPOSIT A DUMMY LAYER OVER THE DIPOLE LAYER

110 — ETCH BACK THE DUMMY LAYER SUCH THAT THE TOP CHANNEL MEMBER IS ABOVE THE DUMMY LAYER

112 — RECESS THE DIPOLE LAYER NOT COVERED BY THE DUMMY LAYER

114 — SELECTIVELY DEPOSIT A SELF-ASSEMBLED MONOLAYER (SAM) OVER THE DUMMY LAYER

116 — SELECTIVELY DEPOSIT A HARD MASK LAYER TO WRAP OVER THE TOP CHANNEL MEMBER

118 — REMOVE THE SAM AND THE DUMMY LAYER

120 — REMOVE THE HARD MASK LAYER

122 — PERFORM A DRIVE-IN PROCESS

124 — REMOVE EXCESS DIPOLE LAYER

126 — FORM A FIRST GATE ELECTRODE AND A SECOND GATE ELECTRODE

Fig. 1

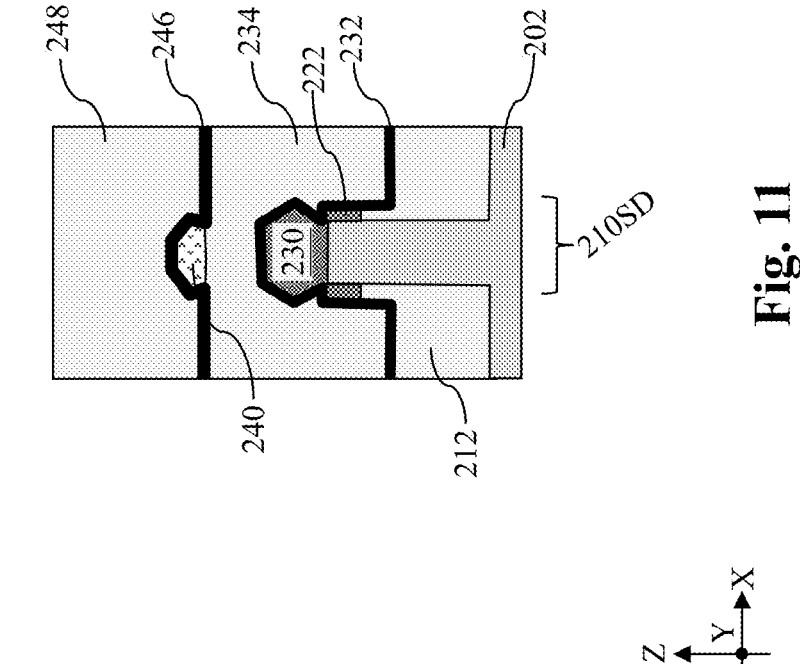
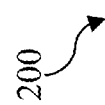
Fig. 11

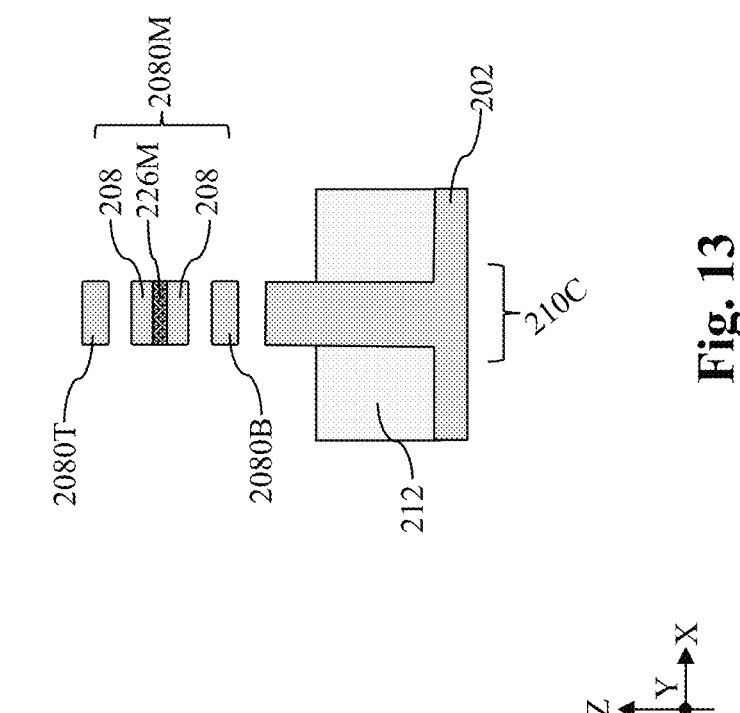
Fig. 13

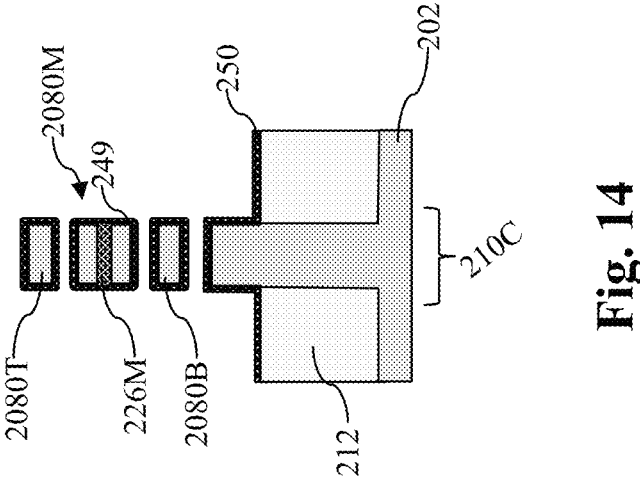
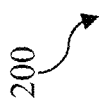
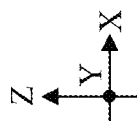
Fig. 14

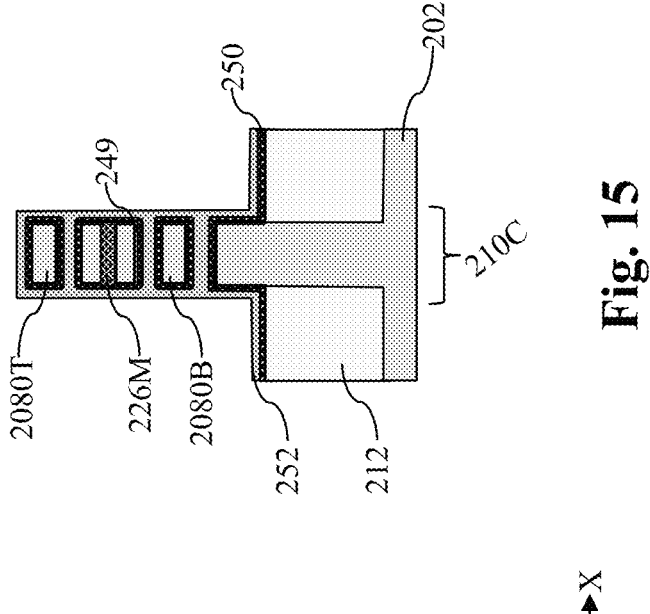
200
2080T
249
226M
2080B
250
202
210C
252
212
Fig. 15
Z
Y
X

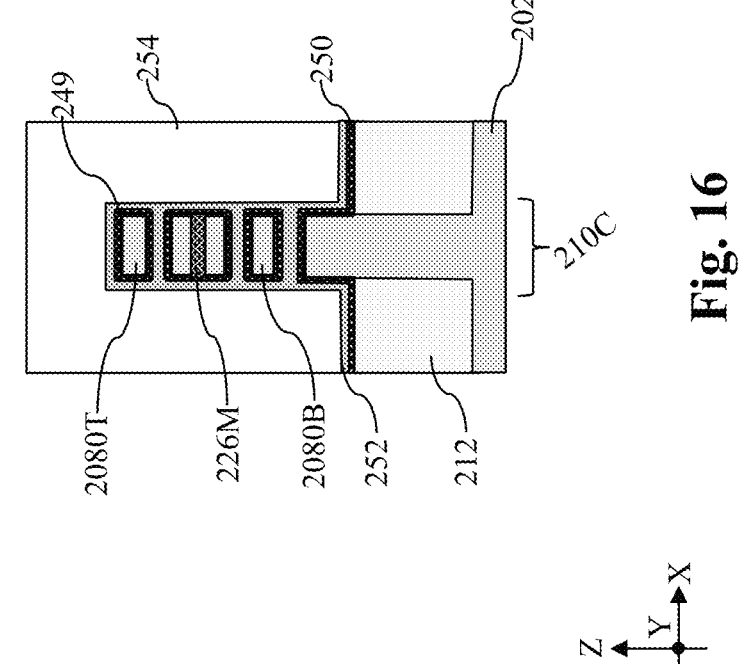
Fig. 16

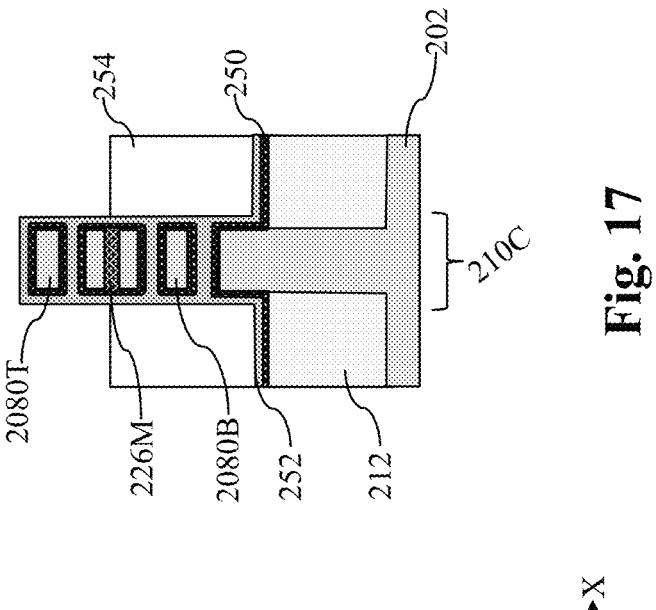
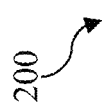
Fig. 17

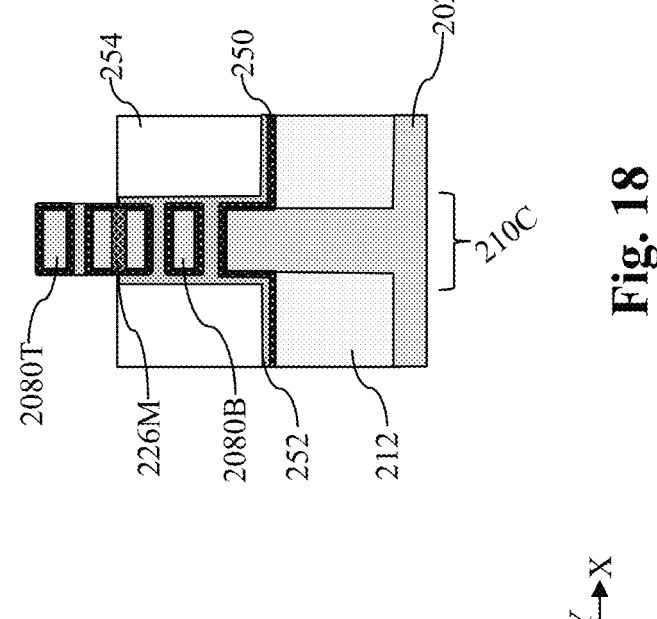
Fig. 18

200
256
254
250
202
2080T
226M
2080B
252
212
210C
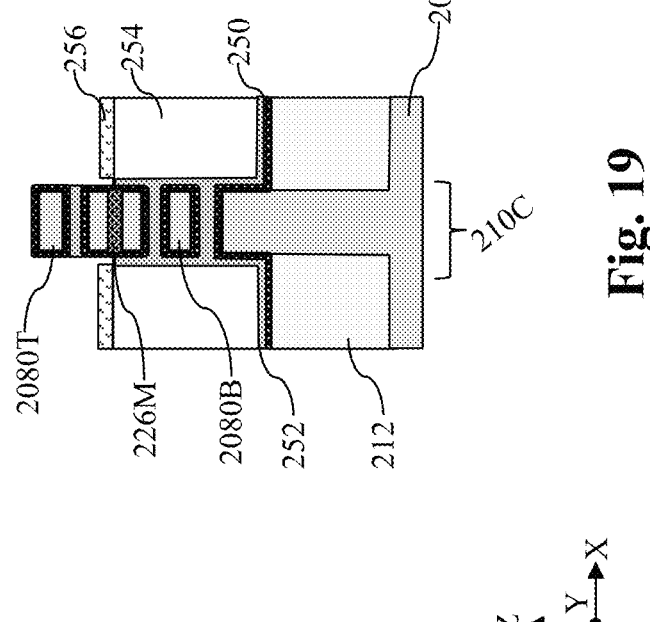
Fig. 19

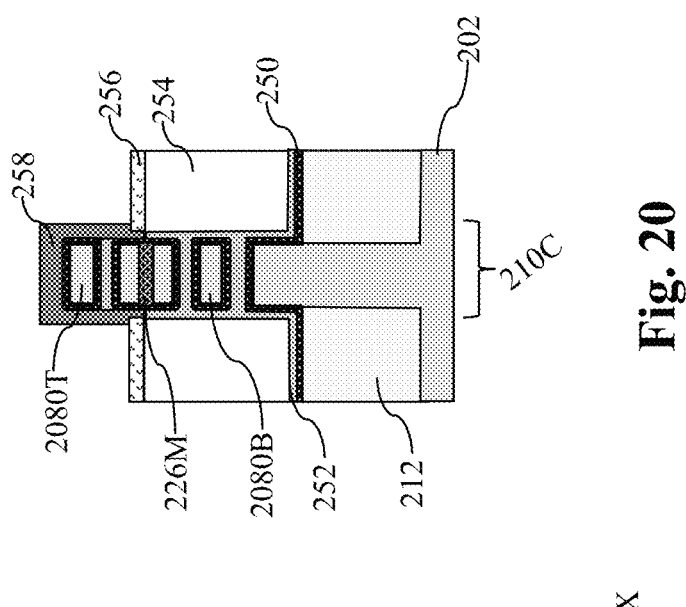
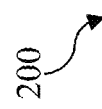
Fig. 20

200

258

254

250

202

2080T

226M

2080B

252

212

Z
Y
X

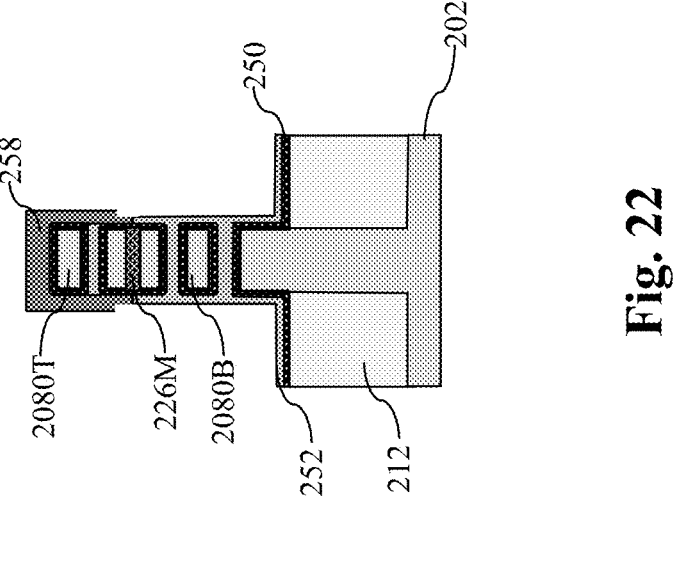
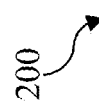
200
258
250
202
2080T
226M
2080B
252
212
Z
Y
X
Fig. 22

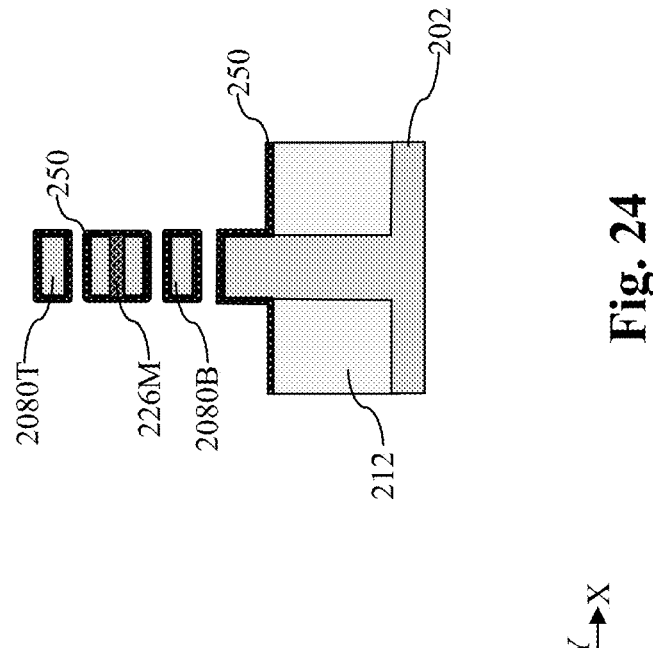
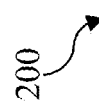
Fig. 24

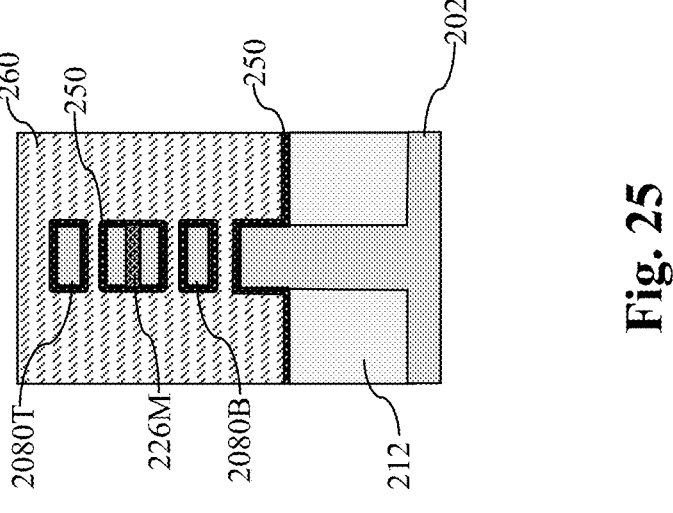
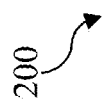
Fig. 25

GATE PATTERNING FOR STACKED DEVICE STRUCTURE USING SELF-ASSEMBLED MONOLAYER

PRIORITY DATA

This application claims priority to U.S. Provisional Patent Application No. 63/490,799, filed on Mar. 17, 2023, which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As the semiconductor industry further progresses into advanced technology process nodes in pursuit of higher device density, higher performance, and lower costs, challenges from both fabrication and design issues have led to stacked device structure configurations, such as complementary field effect transistors (C-FET) where multi-gate transistors are stacked vertically, one over the other.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 illustrates a flow chart of a method for forming a semiconductor device having a vertical C-FET structure, according to one or more aspects of the present disclosure.

FIGS. 2-27 illustrate fragmentary cross-sectional views of a workpiece undergoing various fabrication processes in the method of FIG. 1, according to one or more aspects of the present disclosure.

DETAILED DESCRIPTION

Figure 2:
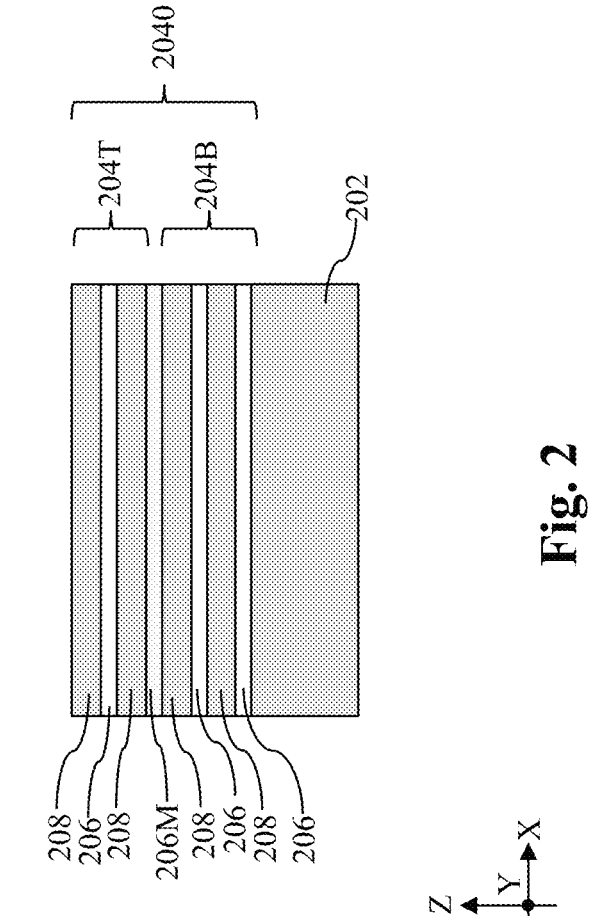

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

Stacked transistor structures can provide further density reduction for advanced integrated circuit (IC) technology nodes (particularly as they advance to 3 nm (N3) and below), especially when the stacked transistor structures include multi-gate devices, such as fin-like field effect transistors (FinFETs), gate-all-around (GAA) transistors including nanowires and/or nanosheets, other types of multi-gate devices, etc. Stacked transistor structures vertically stack transistors. For example, a transistor stack can include a first transistor (e.g., a top transistor) disposed over a second transistor (e.g., a bottom transistor). The transistor stack can provide a complementary field effect transistor (CFET) when the first transistor and the second transistor are of opposite conductivity type (i.e., an n-type transistor and a p-type transistor).

An IC may include numerous transistor stacks. Providing the IC with transistors having multiple threshold voltages (Vt) can maximize its performance and/or reliability, for example, by boosting performance/speed of some transistors of the IC while reducing power consumption of other transistors of the IC. However, providing multi-gate devices with multiple threshold voltages is challenging because multi-gate devices are becoming very small, which leaves minimal room for tuning their threshold voltages using different work function metals. Dipole engineering can flexibly provide multi-gate devices with different threshold voltages by incorporating dipole dopants into gate dielectrics thereof and minimize and/or eliminate the need for using different work function metals. This can obviate the need of patterning work function metals, making dipole engineering very suitable for nano-sized transistors, such as FinFETs and GAA transistors. Although existing dipole engineering techniques have been generally adequate for their intended purposes, they have not been entirely satisfactory in all respects, particularly when implemented in the fabrication of stacked transistors, such as CFETs.

The present disclosure provides gate fabrication techniques, which include dipole engineering, that can realize multi-threshold voltage tuning for transistor stacks. According to various aspects of the present disclosure, a dummy layer, a self-assembled monolayer (SAM), and a hard mask layer are implemented during dipole engineering to facilitate introducing dipole dopant into a bottom gate dielectric of a bottom transistor without introducing such dipole dopant into a top gate dielectric of a top transistor. For example, after forming a dipole dopant source layer (or a dipole layer) on the bottom gate dielectric and the top gate dielectric, processing can include forming the dummy layer over the bottom gate dielectric, removing the dipole dopant source layer from the top gate dielectric, selectively depositing the SAM over the dummy layer, selectively depositing the hard mask layer over the top gate dielectric, removing the SAM, removing the dummy layer, and removing the hard mask layer before and/or after a thermal drive-in process for driving dopant from the dipole dopant source layer into the bottom gate dielectric. The hard mask layer protects the top gate dielectric during removal of the dummy layer, and the SAM enables selective deposition of the hard mask layer so that it does not form on the dummy layer, which can minimize loss of and/or damage to the dummy layer. The patterned dipole dopant source layer is thus provided for adjusting characteristics of the bottom gate dielectric while preserving integrity of the top gate dielectric.

An exemplary method for forming gate structures for a stacked multi-gate device. The method includes forming a bottom channel member and a top channel member over a base fin, where the top channel member is disposed over the bottom channel member. An interfacial layer and a gate dielectric layer are deposited to wrap around the bottom channel member and the top channel member. A dipole dopant source layer (or a dipole layer) is deposited to wrap around the bottom channel member and the top channel member. A dummy layer is then deposited to cover the bottom channel member while the top channel member is above a top surface of the dummy layer. The exposed dipole layer is then etched back. The dummy layer is treated with oxygen plasma to introduce hydroxyl groups over the surfaces of the dummy layer. A SAM that has affinity to bonding between silicon and hydroxyl group is selectively deposited on the top surface of the dummy layer. Due to presence of the SAM on the dummy layer, during the subsequent step to deposit a hard mask layer, the hard mask layer is only deposited around the top channel member but is not deposited on the SAM. After the deposition of the hard mask layer, the SAM and the dummy layer are removed and a dopant species in the dipole layer is thermally driven-in the gate dielectric layer and/or the interfacial layer. After the thermal drive-in, the excess dipole layer is removed. A first gate structure is formed to wrap around the bottom channel member and a second gate structure is formed to wrap around the top channel member. Due to use of the SAM, the hard mask layer may be selectively formed to protect the top channel member during the removal of the dummy layer.

The various aspects of the present disclosure will now be described in more detail with reference to the figures. In that regard, FIG. 1 is a flowchart illustrating method 100 for forming gate structures for a stacked multi-gate device according to various aspects of the present disclosure. Method 100 is merely an example and is not intended to limit the present disclosure to what is explicitly illustrated in method 100. Additional steps may be provided before, during and after method 100 and some steps described can be replaced, eliminated, or moved around for additional embodiments of the method. Not all steps are described herein in detail for reasons of simplicity. Method 100 is described below in conjunction with FIGS. 2-27, which are fragmentary cross-sectional views of a workpiece 200 at different stages of fabrication according to embodiments of method 100. Because the workpiece 200 will be fabricated into a semiconductor device 200 upon conclusion of the fabrication processes, the workpiece 200 may be referred to as the semiconductor device 200 as the context requires. Additionally, throughout the present application and across different embodiments, like reference numerals denote like features with similar structures and compositions, unless otherwise excepted. Source/drain region(s) may refer to a source or a drain, individually or collectively dependent upon the context.

Referring to FIGS. 1 and 2-13, method 100 includes a block 102 where a bottom channel member 2080B and a top channel member 2080T are formed. Operations at block 102 include formation of a superlattice 2040 over a substrate 202 (shown in FIG. 2), patterning the superlattice 2040 to form a fin-shaped structure 210 (shown in FIG. 3), formation of dummy gate stacks 214 over channel regions 210C of the fin-shaped structure 210 (shown in FIG. 4), formation of a gate spacer 222 and recessing of source/drain regions 210SD of the fin-shaped structure 210 (shown in FIGS. 5 and 6), formation of a bottom source/drain feature 230 (shown in FIG. 7), deposition of a bottom contact etch stop layer (CESL) 232 and a bottom interlayer dielectric (ILD) layer 234 (shown in FIG. 8), formation of a top source/drain feature 240 (shown in FIG. 9), deposition of a top CESL 246 and a top ILD layer 248 (shown in FIGS. 10 and 11), and removal of the dummy gate stacks 214 and release of the bottom channel member 2080B and the top channel member 2080T (shown in FIGS. 12 and 13).

Referring to FIG. 2, the substrate 202 may be a silicon (Si) substrate in some embodiments. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (Al- GaAs), gallium indium phosphide (GaInP), and indium gallium arsenide (InGaAs). The substrate 202 may also include an insulating layer, such as a silicon oxide layer, to have a silicon-on-insulator (SOI) structure. Although not explicitly shown in the figures, the substrate 202 may include an n-type well region and a p-type well region for fabrication of transistors of different conductivity types. When present, each of the n-type well and the p-type well is formed in the substrate 202 and includes a doping profile. An n-type well may include a doping profile of an n-type dopant, such as phosphorus (P) or arsenic (As). A p-type well may include a doping profile of a p-type dopant, such as boron (B). The doping in the n-type well and the p-type well may be formed using ion implantation or thermal diffusion and may be considered portions of the substrate 202.

The superlattice 2040 shown in FIG. 2 may include a first stack structure 204B, a germanium-rich sacrificial layer 206M over the first stack structure 204B, and a second stack structure 204T over the germanium-rich sacrificial layer 206M. Each of the first stack structure 204B and the second stack structure 204T includes a plurality of channel layers 208 interleaved by at least one sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. The sacrificial layers 206 and the channel layers 208 are deposited alternatingly, one-after-another, to form the first stack structure 204B or the second stack structure 204T. It is noted that the first stack structure 204B and the second stack structure 204T in FIG. 2 includes two (2) to three (3) layers of the channel layers 208 interleaved by one (1) to two (2) layers of sacrificial layers 206, which is for illustrative purposes only and not intended to be limiting beyond what is specifically recited in the claims. It can be appreciated that any number of the channel layers 208 can be included in each of the first stack structure 204B and the second stack structure 204T and interleaved by a suitable number of sacrificial layers 206. The number of layers depends on the desired number of channels members for the top GAA transistor and the bottom GAA transistor. In some embodiments, the number of the channel layers 208 in each of the first stack structure 204B and the second stack structure 204T may be between 2 and 5. The first stack structure 204B and the second stack structure 204T are spaced apart from one another by a germanium-rich layer 206M, which has a greater germanium content than the other sacrificial layers 206. In some examples, the sacrificial layers 206 include a germanium content between about 10% and about 35% while the germanium-rich layer 206M includes a germanium content between about 40% and about 55%. The increased germanium content in the germanium-rich layer 206M allows the germanium-rich layer 206M to etch faster than the sacrificial layers 206

The channel layers 208 in the first stack structure 204B may provide channel members of a bottom GAA transistor, and the channel layers 208 in the second stack structure 204T may provide channel members of a top GAA transistor. The term "channel member(s)" is used herein to designate any material portion for channel(s) in a transistor with nanoscale dimensions, and having an elongate shape, regardless of the cross-sectional shape of this portion. Channel members may come in forms of nanowires, nanosheet, or other nanostructures and may have cross-sections that are circular, oval, race-track shaped, rectangular, or square. The germanium-rich layer 206M will be removed when the sacrificial layers 206 are selectively recessed to form inner spacer recesses.

The layers in the first stack structure 204B, the germanium-rich layer 206M and the layers in the second stack structure 204T may be deposited one over another over the substrate 202 using vapor-phase epitaxy (VPE), ultra-high vacuum chemical vapor deposition (UHV-CVD), molecular beam epitaxy (MBE), and/or other suitable epitaxy deposition processes.

Figure 3:
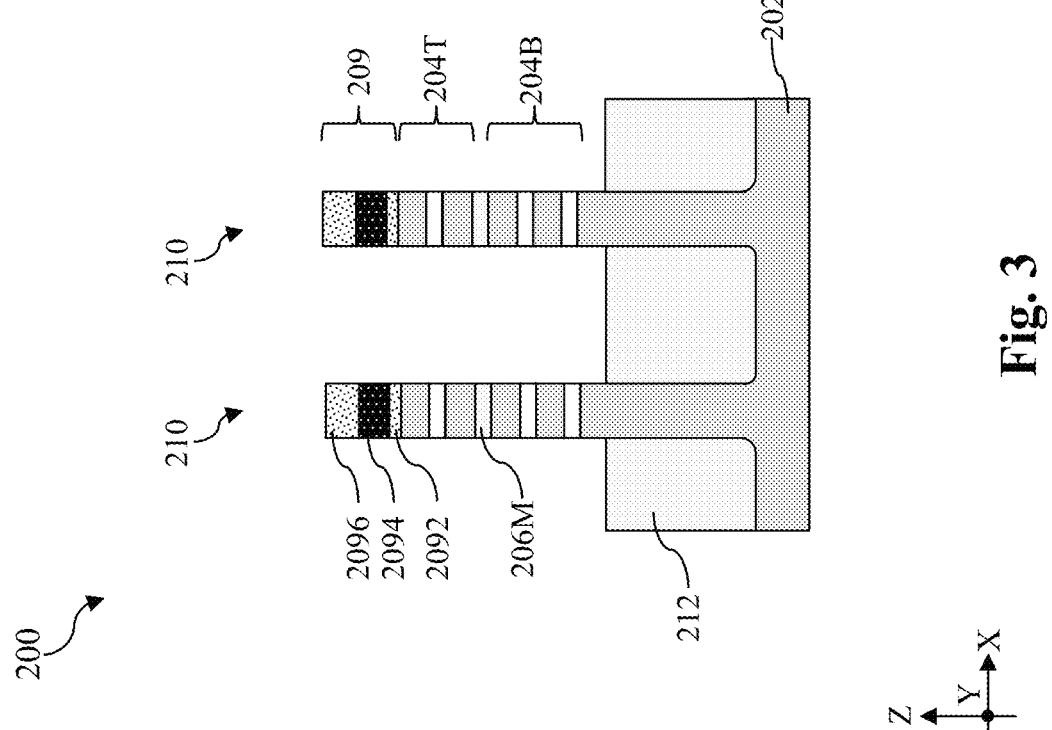

Referring to FIG. 3, a fin-shaped structure 210 is formed from the superlattice 2040 and a portion of the substrate 202. For patterning purposes, a hard mask 209 may be deposited over the superlattice 2040. The hard mask 209 may be a single layer or a multilayer. In one example illustrated in FIG. 3, the hard mask 209 includes a first silicon oxide layer 2092, a silicon nitride layer 2094 over the first silicon oxide layer 2092, and a second silicon oxide layer 2096 over the silicon nitride layer 2094. As shown in FIG. 3, the fin-shaped structure 210 extends vertically along the Z direction from the substrate 202 and extends lengthwise along the Y direction. The fin-shaped structure 210 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used as an etch mask to etch the superlattice 2040 and the substrate 202 to form the fin-shaped structure 210. The etching process may include dry etching, wet etching, reactive ion etching (RIE), and/or other suitable processes.

After the fin-shaped structure 210 is formed, an isolation feature 212 is formed around the fin-shaped structure 210 to separate the fin-shaped structure 210 from an adjacent fin-shaped structure 210. The isolation feature 212 may also be referred to as a shallow trench isolation (STI) feature 212. In an example process, a dielectric material for the isolation feature is deposited over the workpiece 200, including the fin-shaped structure 210, using CVD, subatmospheric CVD (SACVD), flowable CVD (FCVD), spin-on coating, and/or other suitable process. Then the deposited dielectric material is planarized and recessed to form the isolation feature 212. As shown in FIG. 3, the fin-shaped structure 210 rises above the isolation feature 212. The dielectric material for the isolation feature 212 may include silicon oxide, silicon oxynitride, fluorine-doped silicate glass (FSG), a low-k dielectric, combinations thereof, and/or other suitable materials. In the embodiments represented in FIG. 3, a base portion of the fin-shaped structure 210 that is formed from the substrate 202 is buried in the isolation feature 212. This base portion may also be referred to as a base fin. In some embodiments represented in FIG. 3, the portion of the fin-shaped structure 210 that is formed from the superlattice 2040 rises above a top surface of the isolation feature 212.

Figure 4:
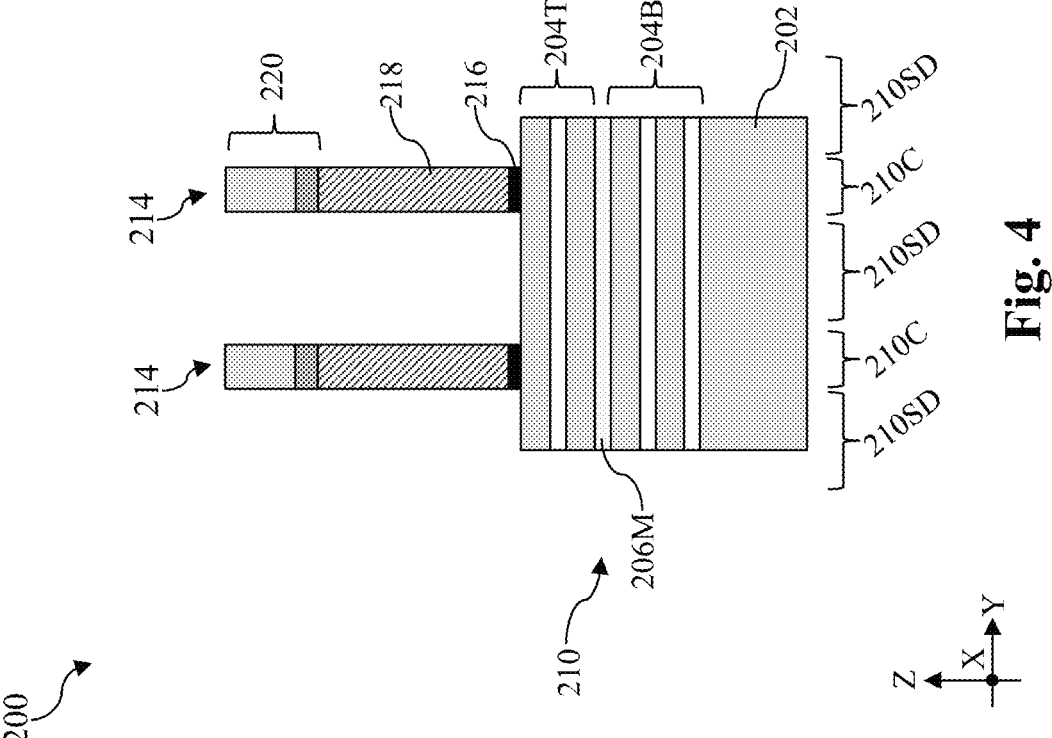

Referring to FIG. 4, a dummy gate stack 214 is formed over a channel region 210C of the fin-shaped structure 210. In some embodiments, a gate replacement process (or gate-last process) is adopted where the dummy gate stack 214 serves as a placeholder for a functional gate structure. Other processes and configuration are possible. To form the dummy gate stack 214, a dummy dielectric layer 216, a dummy gate electrode layer 218, and a gate-top hard mask 220 are deposited over the workpiece 200. The deposition of these layers may include use of low-pressure CVD (LPCVD), CVD, plasma-enhanced CVD (PECVD), PVD, ALD, thermal oxidation, e-beam evaporation, or other suitable deposition techniques, or combinations thereof. The dummy dielectric layer 216 may include silicon oxide, the dummy gate electrode layer 218 may include polysilicon, and the gate-top hard mask 220 may be a multi-layer that includes silicon oxide and silicon nitride. Using photolithography and etching processes, the gate-top hard mask 220 is patterned. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etching process may include dry etching (e.g., RIE etching), wet etching, and/or other etching methods. Like the fin-shaped structures 210, the dummy gate stack 214 may also be patterned using double-patterning or multiple-patterning techniques. Thereafter, using the patterned gate-top hard mask 220 as the etch mask, the dummy dielectric layer 216 and the dummy gate electrode layer 218 are then etched to form the dummy gate stack 214. The dummy gate stack 214 extends lengthwise along the X direction to wrap over the fin-shaped structure 210 and lands on the isolation feature 212. The portion of the fin-shaped structure 210 underlying the dummy gate stack 214 defines a channel region 210C. The channel region 210C and the dummy gate stack 214 also define source/drain regions 210SD that are not vertically overlapped by the dummy gate stack 214. The channel region 210C is disposed between two source/drain regions 210SD along the Y direction.

Figure 5:
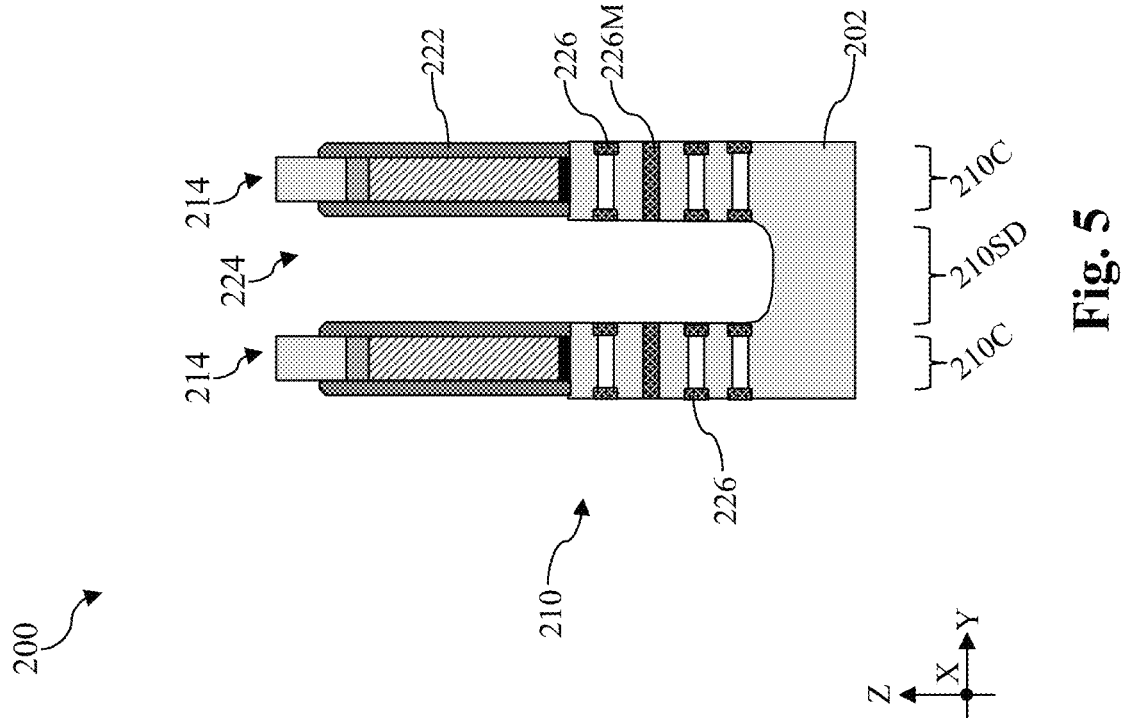

Referring to FIG. 5, a source/drain region 210SD of the fin-shaped structure 210 is recessed to form a source/drain recess 224. To form the source/drain recess 224, a gate spacer layer 222 may be conformally deposited over the workpiece 200 using CVD, SACVD, or ALD. The gate spacer layer 222 may include silicon oxide, silicon nitride, silicon carbide, silicon oxynitride, silicon carbonitride, silicon oxycarbide, silicon oxycarbonitride, and/or combinations thereof. After the deposition of the gate spacer layer 222, the workpiece 200 is etched in an anisotropic etch process to form the source/drain recess 224. The etch process may be a dry etch process or a suitable etch process. An example dry etch process may implement an oxygen-containing gas, hydrogen ($H_2$), a fluorine-containing gas (e.g., $CF_4$, $SF_6$, $NF_3$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. After the anisotropic etch, sidewalls of the sacrificial layers 206, the channel layers 208, and the germanium-rich layer 206M in the channel regions 210C are exposed in the source/drain recess 224. Due to their elongated shapes, the source/drain recess 224 may also be referred to as the source/drain trench 224.

Referring to FIG. 5, inner spacer features 226 are formed. After the formation of the source/drain recess 224, the sacrificial layers 206 in the channel regions 210C are selectively and partially recessed to form inner spacer recesses, while the exposed channel layers 208 are substantially unetched. In an embodiment where the channel layers 208 consist essentially of silicon (Si) and sacrificial layers

206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone ($O_3$). In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include use of hydrogen fluoride (HF) or ammonium hydroxide ($NH_4OH$). Due to its additional germanium content, the germanium-rich layer 206M may be completely removed when the sacrificial layers 206 are partially etched. After the formation of the inner spacer recesses, an inner spacer material layer is deposited over the workpiece 200, including in the inner spacer recesses and the space left behind by the removal of the germanium-rich layer 206M. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excess inner spacer material layer over the gate spacer layer and sidewalls of the channel layers 208, thereby forming the inner spacer features 226 and a middle dielectric layer 226M as shown in FIG. 5. In some embodiments, the etch back process to form the inner spacer recesses may be a dry etch process that includes use of an oxygen-containing gas, hydrogen ($H_2$), nitrogen ($N_2$), a fluorine-containing gas (e.g., $NF_3$, $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas (e.g., $CF_3I$), other suitable gases and/or plasmas, and/or combinations thereof.

Figure 6:
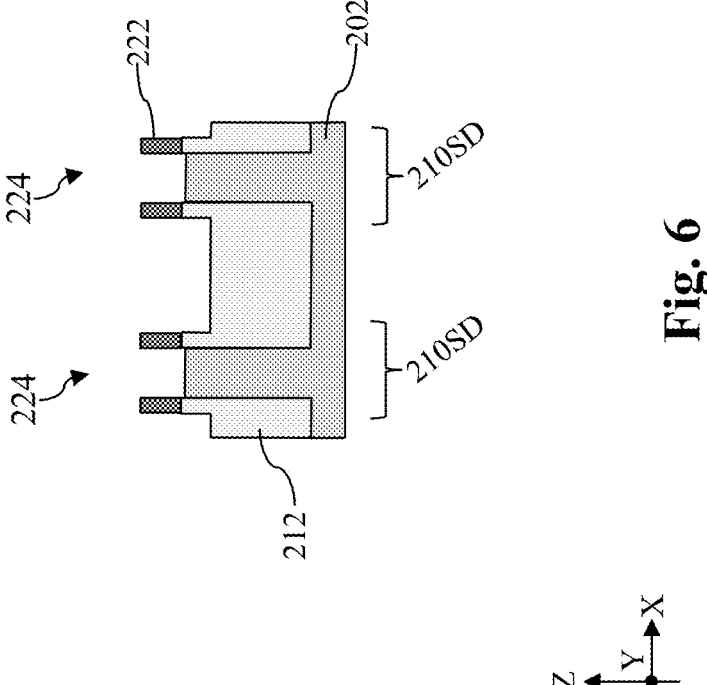

Referring to FIG. 6, because the etch process that etches the source/drain recess 224 etches the gate spacer layer 222 at a slower rate, a bottom portion of the source/drain recess 224 may be defined between portions of the gate spacer layer 222 or even between portions of the isolation feature 212 along the X direction.

Figure 7:
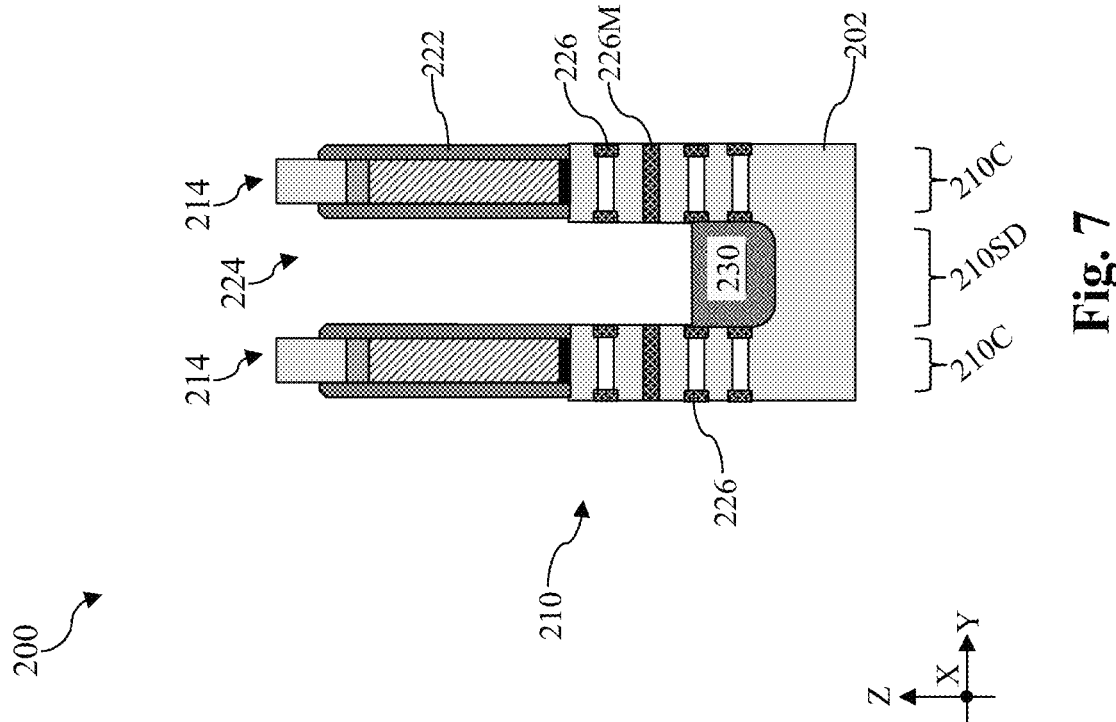

Referring to FIG. 7, a bottom source/drain feature 230 is formed over the source/drain recess 224. The bottom source/drain feature 230 may be formed using an epitaxial process, such as VPE, UHV-CVD, MBE, and/or other suitable processes. The epitaxial growth process may use gaseous and/or liquid precursors, which interact with semiconductor surfaces. The epitaxial growth of the bottom source/drain feature 230 may take place from both a top surface of the substrate 202 and the exposed sidewalls of the channel layers 208 in the first stack structure 204B. While not explicitly shown, a block layer may be formed over sidewalls of the channel layers 208 not designed to engage the bottom source/drain feature 230. As illustrated in FIG. 7, the deposited bottom source/drain feature 230 is in physical contact with (or adjoining) the channel layers 208 formed from the first stack structure 204B. It is noted that the bottom source/drain feature 230 does not contact the channel layers 208 directly above and below the middle dielectric layer 226M. Although the epitaxial growth of bottom source/drain feature 230 is less likely to take place on surfaces of the inner spacer features 226, overgrowth of the bottom source/drain feature 230 allows the bottom source/drain features 230 to merge over the inner spacer features 226. Depending on the design, the bottom source/drain feature 230 may be n-type or p-type. In the depicted embodiments, the bottom source/drain feature 230 is a p-type source/drain feature and may include silicon germanium (SiGe) doped with a p-type dopant, such as boron (B). In some alternative embodiments, the bottom source/drain feature 230 may be an n-type source/drain feature and may include silicon (Si) doped with phosphorus (P). In these depicted embodiments, the bottom source/drain feature 230 includes boron doped silicon germanium (SiGe:B).

Figure 8:
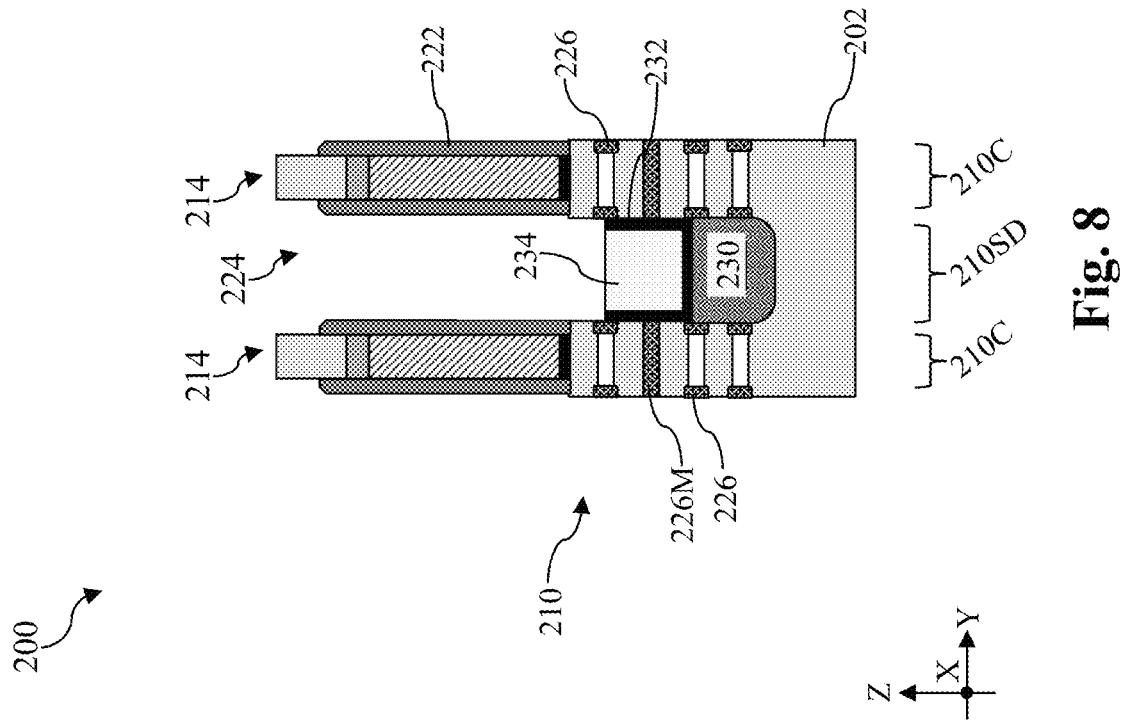

Referring to FIG. 8, a bottom contact etch stop layer (CESL) 232 and a bottom interlayer dielectric (ILD) layer 234 are deposited over the bottom source/drain feature 230. The bottom CESL 232 may include silicon nitride, silicon oxynitride, and/or other materials known in the art. The bottom ILD layer 234 may include materials such as tetra-ethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the bottom CESL 232 is first conformally deposited on the workpiece 200 by CVD, ALD, plasma-enhanced chemical vapor deposition (PECVD) process and/or other suitable deposition or oxidation processes and the bottom ILD layer 234 is deposited over the bottom CESL 232 by spin-on coating, FCVD, CVD, or other suitable deposition technique. In some embodiments, after formation of the bottom ILD layer 234, the workpiece 200 may be annealed to improve integrity of the bottom ILD layer 234. As shown in FIG. 8, the bottom CESL 232 and the bottom ILD layer 234 are etched back to exposed sidewalls of the channel layers 208 formed from the second stack structure 204T. The bottom CESL 232 is in direct contact with top surfaces of the bottom source/drain feature 230 and sidewalls of the middle dielectric layer 226M. Additionally, the bottom CESL 232 is in direct contact with sidewalls of channel layers 208 directly above and below the middle dielectric layer 226M. The bottom ILD layer 234 is spaced apart from the top surfaces of the bottom source/drain features 230 and sidewalls of the channel layers 208 directly above and below the middle dielectric layer 226M by the bottom CESL 232.

Figure 9:
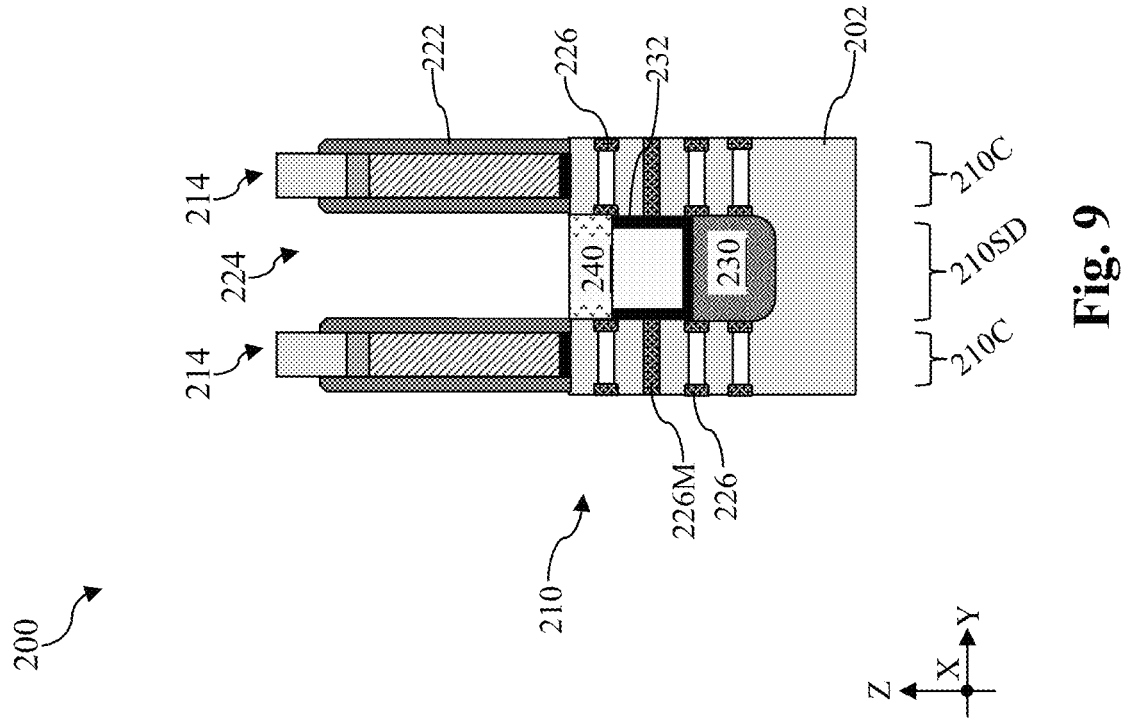

Referring to FIG. 9, a top source/drain feature 240 is formed. The top source/drain feature 240 may be formed using an epitaxial process, such as VPE, UHV-CVD, MBE, and/or other suitable processes. The epitaxial growth process may use gaseous and/or liquid precursors, which interact with composition of the channel layers 208 formed from the second stack structures 204T. The epitaxial growth of top source/drain feature 240 may take place from the exposed sidewalls of the channel layers 208 formed from the second stack structure 204T. The deposited top source/drain feature 240 is in physical contact with (or adjoining) the channel layers 208 formed from the second stack structures 204T. Depending on the design, the top source/drain feature 240 may be n-type or p-type. In the depicted embodiments, the top source/drain feature 240 is an n-type source/drain feature and may include silicon (Si) doped with an n-type dopant, such as phosphorus (P). In these depicted embodiments, the top source/drain features 240 may include phosphorus doped silicon (Si:P). In some alternative embodiments, the top source/drain feature 240 is a p-type source/drain feature and may include boron-doped silicon germanium (SiGe:B).

Figure 10:
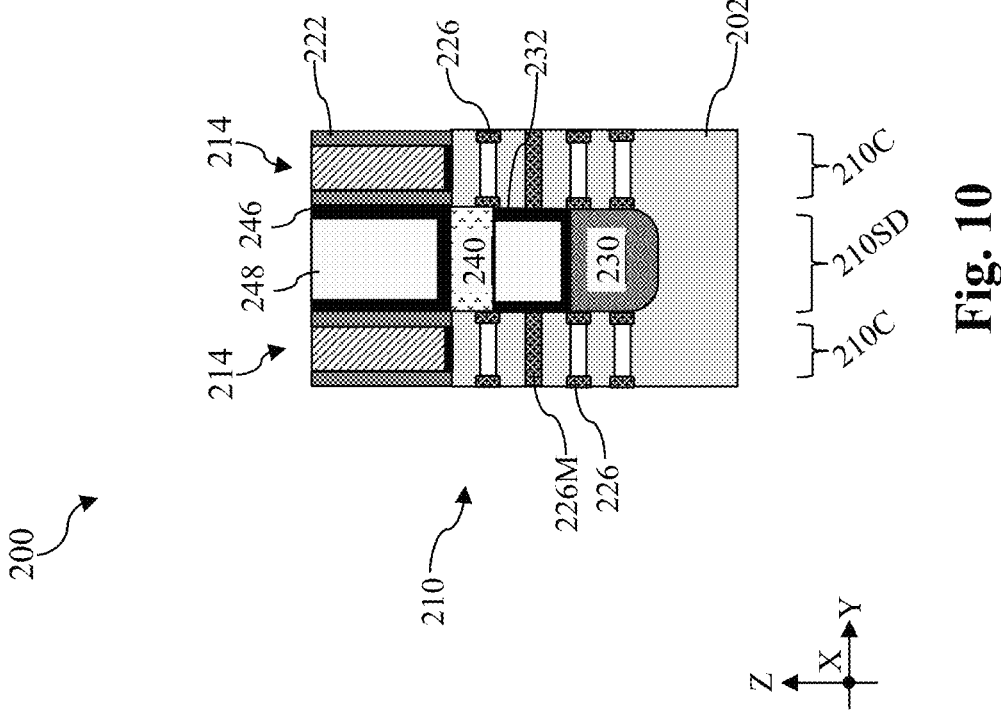

Referring to FIGS. 10 and 11, a top CESL 246 and a top ILD layer 248 are deposited over the top source/drain feature 240. The top CESL 246 may include silicon nitride, silicon oxynitride, and/or other materials known in the art and may be formed by CVD, ALD, plasma-enhanced chemical vapor deposition (PECVD) process and/or other suitable deposition or oxidation processes. In some embodiments, the top CESL 246 is first conformally deposited on the workpiece 200 and the top ILD layer 248 is deposited over the top CESL 246 by spin-on coating. FCVD, CVD, or other suitable deposition technique. The top ILD layer 248 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after formation of the top ILD layer 248, the workpiece 200 may be annealed to improve integrity of the top ILD layer 248. To remove excess materials and to expose top surfaces of the dummy gate stacks 214, a planarization process, such as a chemical mechanical polishing (CMP) process may be performed. The top CESL 246 is in direct contact with top surfaces of the top source/drain features 240 and sidewalls of the gate spacer layer 222. The top ILD layer 248 is spaced apart from top surfaces of the top source/drain features 240 and sidewalls of the gate spacer layer 222 by the top CESL 246.

Figure 12:
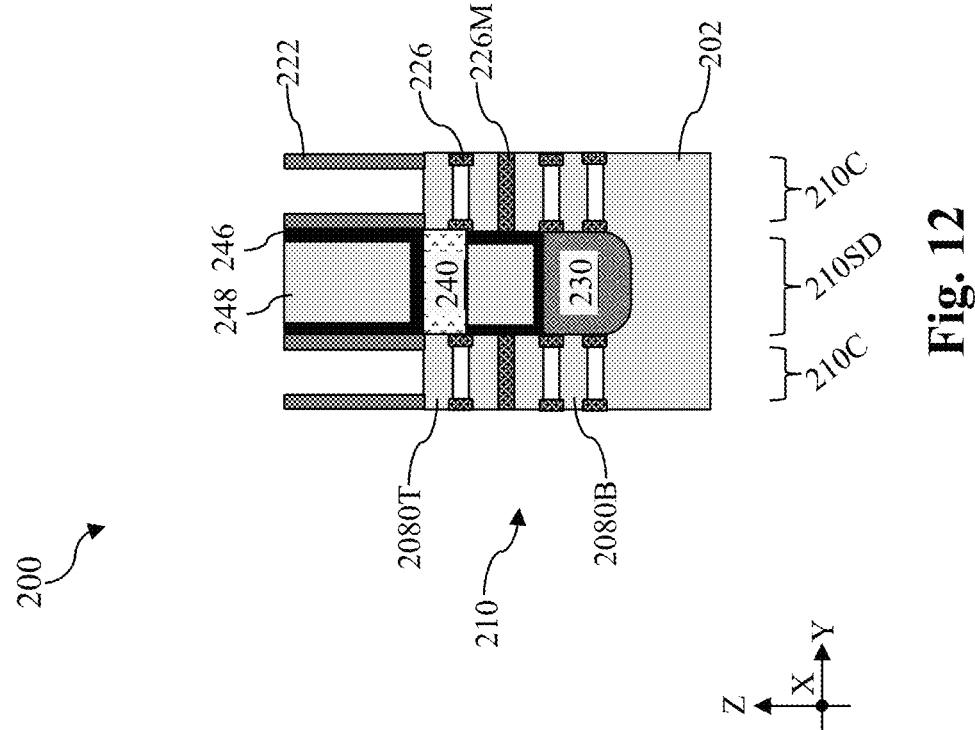

Referring to FIGS. 12 and 13, the dummy gate stack 214 is removed and sacrificial layers 206 in the channel region 210C are selectively removed to release at least one bottom channel member 2080B and at least one top channel member 2080T. The removal of the dummy gate stacks 214 may include one or more etching processes that are selective to the material in the dummy gate stacks 214. For example, the removal of the dummy gate stacks 214 may be performed using a selective wet etch, a selective dry etch, or a combination thereof. After the removal of the dummy gate stacks 214, sidewalls of the channel layers 208 and sacrificial layers 206 in the channel regions 210C are exposed. Thereafter, the sacrificial layers 206 in the channel regions 210C are selectively removed to release at least one of the channel layers 208 formed from the first stack structure 204B as at least one bottom channel member 2080B and at least one of the channel layers 208 formed from the second stack structure 204T as at least one of the top channel members 2080T. While FIG. 12 illustrates one bottom channel member 2080B and one top channel member 2080T, it should be understood that more bottom channel members 2080B and top channel members 2080T may be formed when the superlattice 2040 includes more channel layers 208 and sacrificial layers 206 below and above the germanium-rich layer 206M. In the depicted example, the bottom channel member 2080B is disposed below the middle dielectric layer 226M and the top channel member 2080T is disposed above the middle dielectric layer 226M. Here, because the dimensions of the bottom channel member 2080B and the top channel member 2080T are nanoscale, they may also be referred to as nanostructures. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some other embodiments, the selective removal includes SiGe oxidation followed by a silicon germanium oxide removal. For example, the oxidation may be provided by ozone clean and then silicon germanium oxide removed by an etchant such as $NH_4OH$.

Reference is now made to FIG. 13. In addition to the bottom channel member 2080B and the top channel member 2080T, the middle dielectric layer 226M, along with the channel layers 208 immediately below and above it, may become suspended when the bottom channel member 2080B and the top channel member 2080T are released. For case of reference, the two channel layers 208 and the middle dielectric layer 226M directly sandwiched therebetween may be collectively referred to as a middle member 2080M. Due to the presence of the middle dielectric layer 226M, the subsequently forming interfacial layer, gate dielectric layer, dipole layer, and gate electrode do not extend between these two channel layers 208. Additionally, as shown in FIG. 10, these two channel layers 208 as well as the middle dielectric layer 226M are end-capped by the bottom CESL 232. For that reason, these two channel layers 208 are disabled and do not function as channel members.

Referring to FIGS. 1 and 14, method 100 includes a block 104 where a gate dielectric layer 250 is formed around the bottom channel member 2080B and the top channel member 2080T. Operations at block 104 may include formation of an interfacial layer 249 on semiconductor surfaces and deposition of the gate dielectric layer 250 to wrap around the bottom channel member 2080B, the top channel member 2080T, and the middle member 2080M. The interfacial layer 249 includes silicon oxide and may be formed in a pre-clean process. An example pre-clean process may include use of RCA SC-1 (ammonia, hydrogen peroxide and water) and/or RCA SC-2 (hydrochloric acid, hydrogen peroxide and water). As shown in FIG. 14, the interfacial layer 249 is formed on semiconductor surfaces, such as the exposed surfaces of the base fin that is patterned from the substrate 202 and exposed surfaces of the bottom channel member 2080B, the top channel member 2080T, and the channel layers 208 of the middle member 2080M. That is, in general, the interfacial layer 249 does not form on surfaces of the middle dielectric layer 226M or surfaces of the isolation feature 212. The gate dielectric layer 250 is then deposited over the interfacial layer 249 using ALD. CVD, and/or other suitable methods. The gate dielectric layer 250 is formed of high-K dielectric materials. As used and described herein, high-k dielectric materials include dielectric materials having a high dielectric constant, for example, greater than that of thermal silicon oxide (~3.9). In one embodiment, the gate dielectric layer 250 may include hafnium oxide. In some instances, the gate dielectric layer 250 may have a thickness between about 1 Å and about 20 Å. Different from the interfacial layer 249, the gate dielectric layer 250 may be deposited on sidewalls of the middle dielectric layer 226M or a top surface of the isolation feature 212.

Referring to FIGS. 1 and 15, method 100 includes a block 106 where a dipole layer 252 is deposited around the bottom channel member 2080B and the top channel member 2080T. In some embodiments, the dipole layer 252 may include lanthanum oxide ($La_2O_3$), zirconium oxide ($ZrO_2$), or aluminum oxide ($Al_2O_3$). The dipole layer 252 may be deposited using ALD or CVD. In some instances, the dipole layer 252 may be deposited to a thickness between about 1 Å and about 20 Å. Like the gate dielectric layer 250, the dipole layer 252 wraps around the bottom channel member 2080B, the middle member 2080M, and the top channel member 2080T. Additionally, a portion of the dipole layer 252 may be deposited over top surfaces of the gate dielectric layer 250 on the isolation feature 212.

Referring to FIGS. 1 and 16, method 100 includes a block 108 where a dummy layer 254 is deposited over the dipole layer. In some embodiments, the dummy layer 254 may include a photoresist layer or a bottom antireflective coating (BARC) layer. The dummy layer 254 may include silicon (Si), oxygen (O), and carbon (C). In some instances, the dummy layer 254 may have a carbon content between about 3% and about 10%. In some embodiments, the dummy layer 254 may be deposited using spin-on coating or flowable CVD (FCVD). As shown in FIG. 16, the dummy layer 254 is disposed over the dipole layer 252 and a top surface of the dummy layer 254 is higher than a topmost surface of the dipole layer 252.

Referring to FIGS. 1 and 17, method 100 includes a block 110 where the dummy layer 254 is etched back such that the top channel member 2080T and a portion of the middle member 2080M rise above a top surface of the dummy layer 254. At block 110, the dummy layer 254 may be anisotropically etched back using a dry etch process that uses argon (Ar), oxygen ($O_2$), helium (He), hydrogen ($H_2$), hydrogen fluoride (HF), ammonia ($NH_3$), a plasma thereof, or a combination thereof. The etching back at block 110 reduces the height of dummy layer 254 such that the top channel member 2080T and a portion of the middle member 2080M (along with the gate dielectric layer 250 and the dipole layer 252 deposited thereon) rise above the top surface of the dummy layer 254. That is, the etched back dummy layer 254 protects the dipole layer 252 around the bottom channel member 2080B but leaves the dipole layer 252 around the top channel member 2080T exposed for subsequent process steps.

Referring to FIGS. 1 and 18, method 100 includes a block 112 where the dipole layer 252 that is not covered by the dummy layer 254 is recessed. After the etching back of the dipole layer 252 at block 110, the dipole layer 252 around the top channel member 2080T and a top portion of the middle member 2080M is exposed for recessing. In some embodiments, the exposed dipole layer 252 may be recessed or partially removed using a wet etch process that uses hydrochloric acid (HCl), RCA SC-1 (ammonia, hydrogen peroxide and water), RCA SC-2 (hydrochloric acid, hydrogen peroxide and water), or a combination thereof. As shown in FIG. 18, while most of the exposed portion of the dipole layer 252 may be removed at block 112, a portion of the dipole layer 252 disposed between the top channel member 2080T and the middle member 2080M may remain.

Referring to FIGS. 1 and 19, method 100 includes a block 114 where a self-assembled monolayer (SAM) 256 is selectively deposited over the dummy layer 254. Operations at block 114 include pre-treatment of the dummy layer 254 using oxygen plasma and deposition of the SAM 256. The SAM 256 includes a molecule that has a head group and a tail group. In some embodiments, the head group has high affinity to hydroxyl-silicon bonding but poor or no affinity to hydroxyl groups on metal surfaces. In some instances, the head group may include moiety that can react or interact with the hydroxyl-silicon bonding on the dummy layer 254. For example, the head group may include a silane moiety, a phosphonate moiety, a carboxylate moiety, a catechol moiety, an alkyne moiety, an alkene moiety, or an amine moiety. The tail group of the molecule may include an alkyl group. Once the SAM 256 is deposited, the alkyl group provides steric hindrance to deposition of a hard mask layer (such as the hard mask layer 258 described below). While a bulky or a long alkyl group may provide better steric hindrance and passivate the dipole layer 252 better, the alkyl group here may not be too long or too bulky for this application because bulky or lengthy tail group will prevent the SAM molecule to reach small gate trenches. In some instances, the alkyl group in the tail group may include 1 to 10 carbon (C) atoms. The pre-treatment with oxygen plasma increases the population of silicon-hydroxyl bonding on the top surface of the dummy layer 254, which facilitates selective deposition of the SAM 256 on the top surface of the dummy layer 254, as illustrated in FIG. 19. In some embodiments, the pre-treatment may include a process temperature between room temperature (about 25° C.) and about 400° C. Because the head group of the molecules in the SAM 256 has no or poor affinity to the metal-hydroxyl group bonding on the dipole layer 252, little or no SAM 256 may be deposited on the exposed dipole layer 252. In some embodiments, the deposition of the SAM 256 includes a cyclic deposition process that includes a plurality of process cycles, such as between 5 and 20. Each of the process cycle may include deposition of the SAM 256 and flushing with deionized (DI) water. The DI water flushing helps remove SAM 256 that is loosely attached to the dipole layer 252. The deposition of the SAM 256 may include a process temperature between about room temperature (about 25° C.) and about 450° C. The process temperature for depositing of the SAM 256 may not exceed 450° C. or the molecules in the SAM 256 may start to decompose. In some instances, the SAM 256 may have a thickness between about 5 Å and about 20 Å.

Referring to FIGS. 1 and 20, method 100 includes a block 116 where a hard mask layer 258 is selectively deposited to wrap over the top channel member 2080T. With the SAM 256 passivating the top surface of the dummy layer 254, the hard mask layer 258 may be selectively deposited on the dipole layer 252, including into small crevices between sidewalls of the SAM 256 and the dipole layer 252. In some embodiments, the hard mask layer 258 may include titanium nitride (TiN) or titanium oxide (TiO$_2$). The hard mask layer 258 may be deposited using ALD or CVD. In some instances, the hard mask layer 258 may include a thickness between about 10 Å and about 100 Å.

Figure 21:
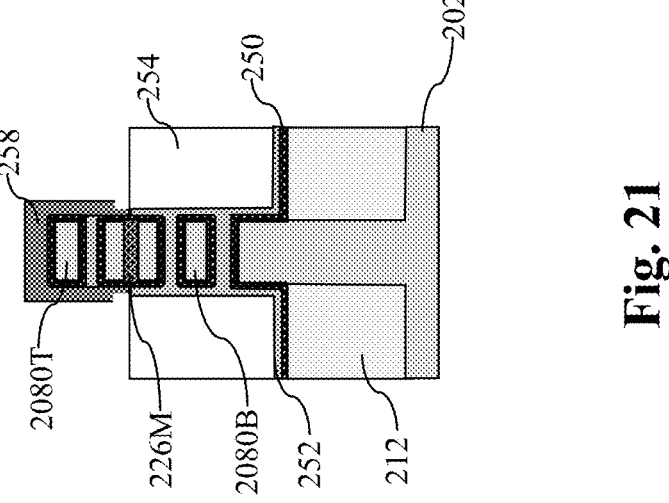

Referring to FIGS. 1, 21 and 22, method 100 includes a block 118 where the SAM 256 and the dummy layer 254 are removed. The SAM 256 may be removed using a dry etch process or an ashing process that includes use of oxygen plasma, hydrogen plasma, nitrogen plasma, or a combination thereof. In some instances, the removal of the SAM 256 may include a process temperature between about 350° C. and about 450° C. The dummy layer 254 may be removed using a dry etch process that uses argon (Ar), oxygen (O$_2$), helium (He), hydrogen (H$_2$), hydrogen fluoride (HF), ammonia (NH$_3$), a plasma thereof, or a combination thereof.

Figure 23:
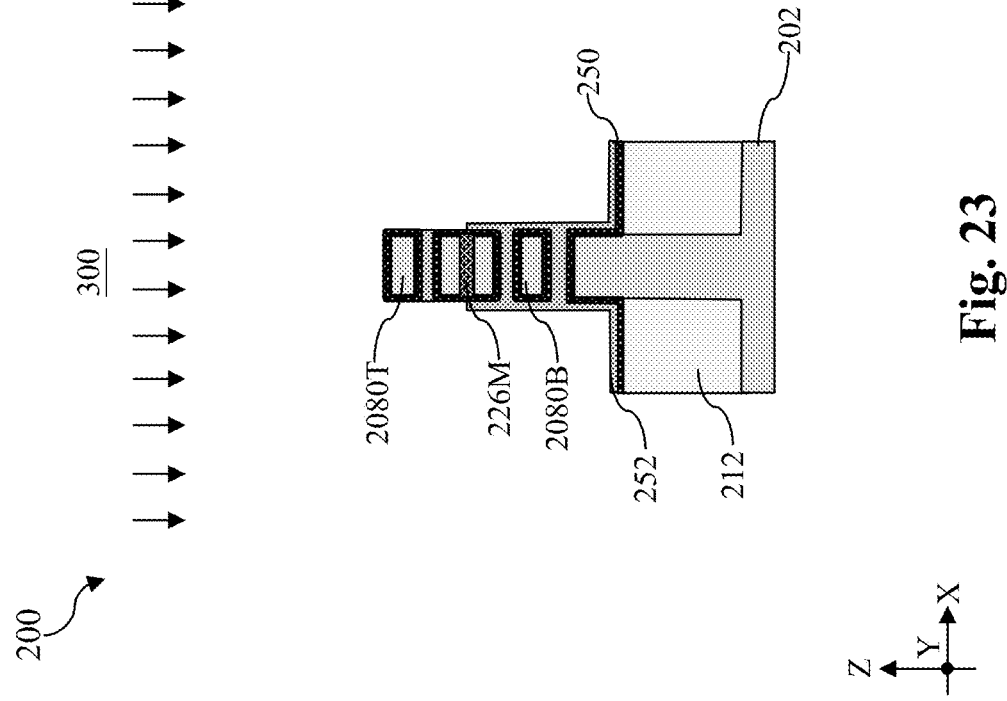

Referring to FIGS. 1 and 23, method 100 includes a block 120 where the hard mask layer 258 is removed. The hard mask layer 258 functions to protect the top channel member 2080T as well as the gate dielectric layer 250 wrapping around the top channel member 2080T during the patterning of the dipole layer 252 and the removal of the dummy layer 254. Once the dipole layer 252 is patterned and the dummy layer 254 is completely removed, method 100 selectively removes the hard mask layer 258. In some embodiments, the hard mask layer 258 may be selectively removed using a wet etch process or a dry etch process. For example, when the hard mask layer 258 includes titanium nitride (TiN), the hard mask layer 258 may be removed using a wet etch process that includes ammonium hydroxide (NH$_4$OH) and hydrogen peroxide (H$_2$O$_2$) or a dry etch process that includes a chlorine containing precursor (e.g., HCl, Cl$_2$, BCl$_3$) and a hydrocarbon (e.g., CH$_4$, C$_2$H$_6$).

Referring to FIGS. 1 and 23, method 100 includes a block 122 wherein a thermal drive-in process 300 is performed. The thermal drive-in process 300 cause a dipole dopant species in the dipole layer 252 to diffuse into the gate dielectric layer 250 or to an interface between the interfacial layer 249 and the gate dielectric layer 250. That is, the thermal drive-in process 300 drives in the dipole dopant species into the gate dielectric layer 250 or to an interface between the interfacial layer 249 and the gate dielectric layer

250. The thermal drive-in process 300 may include rapid thermal annealing (RTA), millisecond annealing (MSA), microsecond annealing (USA), or other suitable annealing processes. In some implementations, the thermal drive-in process 300 includes an annealing temperature between about 500° C. and about 1200° C.

Referring to FIGS. 1 and 24, method 100 includes a block 124 where excess dipole layer 252 is removed. After the dipole dopant species is thermally driven-in at block 122, the excess dipole layer 252 is removed to make room for a first gate electrode 260 and a second gate electrode 264 to be described further below. At block 124, the excess dipole layer 252 may be removed using a wet etch process that uses hydrochloric acid (HCl), RCA SC-1 (ammonia, hydrogen peroxide and water), RCA SC-2 (hydrochloric acid, hydrogen peroxide and water), or a combination thereof.

Referring to FIGS. 1 and 25-27, method 100 includes a block 126 where a first gate electrode 260 and a second gate electrode 264 are formed. Operations at block 126 include deposition of the first gate electrode 260 to wrap around the bottom channel member 2080B, deposition of an insulation layer 262 to electrically isolate the first gate electrode 260 from the to-be-deposited second gate electrode 264, and deposition of the second gate electrode 264. The first gate electrode 260 and the second gate electrode 264 may include titanium nitride (TiN), titanium aluminum (TiAl), molybdenum (Mo), or ruthenium (Ru). In some embodiments, despite the dipole engineering described above to provide different threshold voltages, compositions of the first gate electrode 260 and the second gate electrode 264 may still be different to further increase the threshold voltage differences. Out of the examples, titanium nitride (TIN), molybdenum (Mo) and ruthenium (Ru) may be considered p-type work function metal materials and titanium aluminum (TiAl) may be considered an n-type work function metal material. In some other embodiments, the dipole engineering described above determines the threshold voltage of the top and bottom GAA transistors and the first gate electrode 260 and the second gate electrode 264 may have the same composition. The insulation layer 262 may include silicon oxycarbonitride or silicon oxycarbide and may include a carbon content between about 1% and about 6%.

Figure 26:
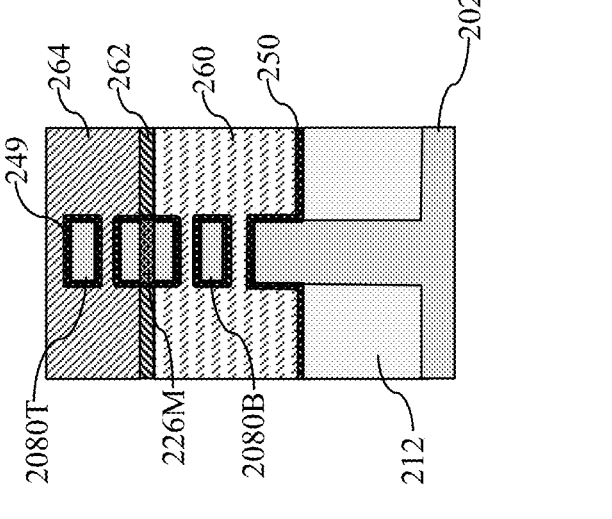

In an example process, the first gate electrode 260 is first deposited, using ALD or CVD to wrap around the bottom channel member 2080B, the middle member 2080M, and the top channel member 2080T, as shown in FIG. 25. Then the first gate electrode 260 is etched back using a suitable process, such as a dry etch process that includes a chlorine containing precursor (e.g., HCl, Cl$_2$, BCl$_3$) and a hydrocarbon (e.g., CH$_4$, C$_2$H$_6$), until a top surface of the first gate electrode 260 is substantially coplanar with a bottom surface of the middle dielectric layer 226M. After the etching back, the insulation layer 262 is deposited over the first gate electrode 260 using ALD or CVD. Excess insulation layer 262 that may wrap partially around the top channel member 2080T is then trimmed or recessed to expose the gate dielectric layer 250 around the top channel member 2080T. Finally, the second gate electrode 264 is deposited, using ALD or CVD, to wrap around the top channel member 2080T, as shown in FIG. 26. The first gate electrode 260, the interfacial layer 249 around the bottom channel member 2080B and the gate dielectric layer 250 around the bottom channel member 2080B may be collectively referred to a first gate structure 270 or a bottom gate structure 270. The second gate electrode 264, the interfacial layer 249 around the top channel member 2080T and the gate dielectric layer

250 around the top channel member 2080T may be collectively referred to a second gate structure 280 or a top gate structure 280.

Figure 27:
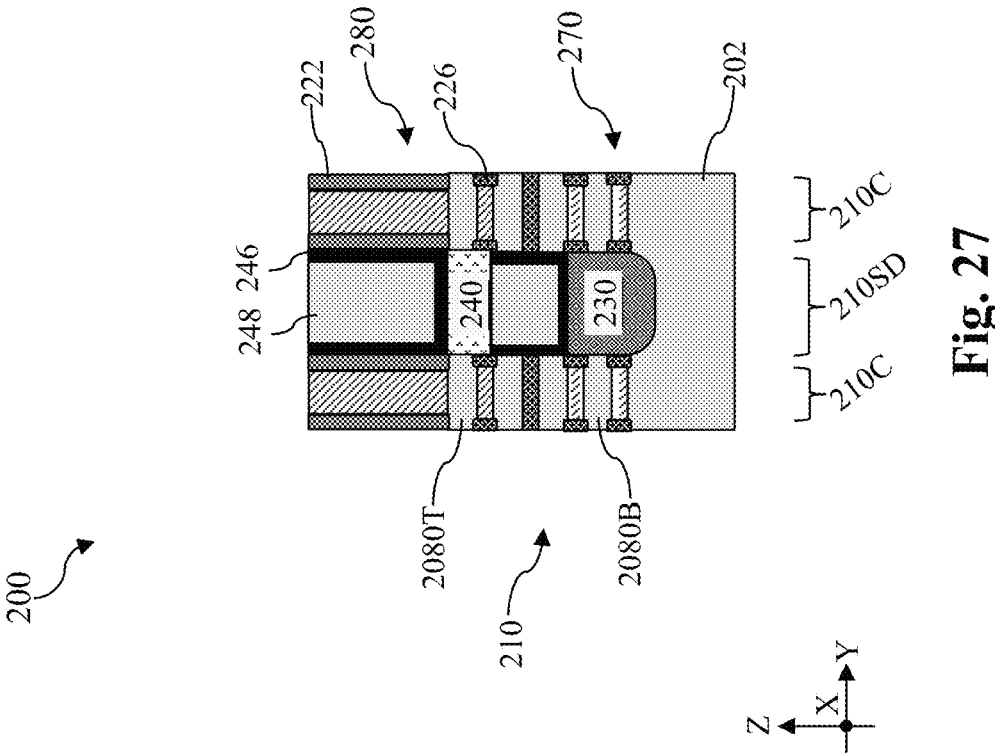

Reference is made to FIG. 27. The first gate structure 270 engages the bottom channel member 2080B to form a bottom GAA transistor. The second gate structure 280 engages the top channel member 2080T to form a top GAA transistor. Sidewalls of the bottom channel member 2080B are in contact with the bottom source/drain features 230. Sidewalls of the top channel member 2080T are in contact with the top source/drain features 240.

In one exemplary aspect, the present disclosure is directed to a method. The method includes forming a gate dielectric layer to wrap around a bottom channel member and a top channel member that is disposed over the bottom channel member, depositing a dipole layer over the gate dielectric layer to wrap around the bottom channel member and the top channel member, forming a dummy layer such that the bottom channel member is disposed below a top surface of the dummy layer and the top channel member is disposed above the top surface of the dummy layer, removing the dipole layer around the top channel member to expose the gate dielectric layer around the top channel member, forming a self-assembled monolayer (SAM) on the top surface of the dummy layer, after the forming of the SAM, depositing a hard mask layer to wrap over the top channel member, removing the SAM and the dummy layer, removing the hard mask layer, after the removing of the hard mask layer, performing a thermal drive-in process to drive a dipole dopant species from the dipole layer into the gate dielectric layer around the bottom channel member, and removing the dipole layer.

In some embodiments, the method further includes forming a first gate electrode to wrap around the bottom channel member, depositing an insulation layer over the first gate electrode, and forming a second gate electrode to wrap around the top channel member. In some instances, the SAM is selectively formed on the dummy layer without forming on the gate dielectric layer and the hard mask layer is selectively formed on the gate dielectric layer without forming on the SAM. In some embodiments, the SAM includes a molecule that has a head group and a tail group. The head group includes a stronger affinity to a bond between a hydroxyl group and silicon than to a bond between a hydroxyl group and metal. In some instances, the head group includes a silane moiety, a phosphonate moiety, a carboxylate moiety, a catechol moiety, an alkyne moiety, an alkene moiety, or an amine moiety. In some embodiments, the tail group includes an alkyl group. In some embodiments, a number of carbon atoms in the alkyl group is between 1 and 10. In some instances, the gate dielectric layer includes hafnium oxide and the dummy layer includes silicon, oxygen and carbon. In some implementations, the dipole layer comprises lanthanum oxide, zirconium oxide, or aluminum oxide. In some embodiments, the hard mask layer includes titanium nitride or titanium oxide.

In another exemplary aspect, the present disclosure is directed to a method. The method includes forming a workpiece that includes a base fin, a bottom channel layer, a middle member over the bottom channel layer, the middle member having a middle dielectric layer sandwiched between and in contact with two middle channel layers, and a top channel layer over the middle member, forming a gate dielectric layer to wrap around the bottom channel layer, the middle member and the top channel layer, depositing a dipole layer over the gate dielectric layer to wrap around the bottom channel layer, the middle member and the top channel layer, after the depositing of the dipole layer, depositing a dummy layer over the workpiece, etching back the dummy layer such that the top channel layer and a portion of the middle member rise above a top surface of the dummy layer, after the etching back, removing a portion of the dipole layer over a top surface and sidewalls of the top channel layer to expose the gate dielectric layer around the top channel layer, selectively forming a self-assembled monolayer (SAM) on the top surface of the dummy layer, after the selectively forming, selectively depositing a hard mask layer to wrap over the top channel layer, removing the dummy layer and the SAM, removing the hard mask layer, after the removing of the hard mask layer, performing a thermal drive-in process to drive a dipole dopant species from the dipole layer into the gate dielectric layer around the bottom channel layer, and removing the dipole layer.

In some embodiments, the etching back includes a dry etch process that uses hydrogen fluoride or ammonia. In some implementations, the removing of the portion of the dipole layer includes a wet etch process that uses hydrochloric acid, ammonium hydroxide, hydrogen peroxide, or combinations thereof. In some instances, the method further includes before the selectively forming of the SAM, treating the dummy layer with oxygen plasma. In some embodiments, after the selectively depositing of the hard mask layer, a portion of the hard mask layer is sandwiched between the portion of the middle member and the SAM. In some embodiments, the removing of the SAM includes a dry etch process that uses oxygen plasma, hydrogen plasma, nitrogen plasma, or a combination thereof. In some embodiments, the method further includes before the forming of the gate dielectric layer, forming an interfacial layer on exposed surfaces of the base fin, the bottom channel layer, the two middle channel layers, and the top channel layer.

In yet another exemplary aspect, the present disclosure is directed to a method. The method includes forming an interfacial layer on surfaces of a bottom channel member and a top channel member that is disposed over the bottom channel member, forming a gate dielectric layer over the interfacial layer to wrap around the bottom channel member and the top channel member, depositing a dipole layer over the gate dielectric layer to wrap around the bottom channel member and the top channel member, depositing a dummy layer over the dipole layer, etching back the dummy layer such that the top channel member rises above a top surface of the dummy layer, removing the dipole layer around the top channel member to expose the gate dielectric layer around the top channel member, treating a top surface of the dummy layer with oxygen plasma, passivating the top surface of the dummy layer with a self-assembled monolayer (SAM), after the passivating, depositing a hard mask layer to wrap over the top channel member while the hard mask layer is not deposited on the SAM, removing the SAM and the dummy layer, removing the hard mask layer, after the removing of the hard mask layer, performing a thermal drive-in process to drive a dipole dopant species from the dipole layer into the gate dielectric layer and the interfacial layer around the bottom channel member, and removing the dipole layer.

In some embodiments, the passivating includes a number of process cycles. Each of the number of process cycles includes depositing the SAM on the top surface of the dummy layer, and flushing the top surface of the dummy layer with deionized (DI) water. In some embodiments, the SAM includes a molecule that has a head group and a tail group and the head group includes a silane moiety, a phosphonate moiety, a carboxylate moiety, a catechol moiety, an alkyne moiety, an alkene moiety, or an amine moiety and the tail group includes an alkyl chain with a number of carbon atoms between 1 and 10.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a gate dielectric layer to wrap around a bottom channel member and a top channel member that is disposed over the bottom channel member;
   depositing a dipole layer over the gate dielectric layer to wrap around the bottom channel member and the top channel member;
   forming a dummy layer such that the bottom channel member is disposed below a top surface of the dummy layer and the top channel member is disposed above the top surface of the dummy layer;
   removing the dipole layer around the top channel member to expose the gate dielectric layer around the top channel member;
   forming a self-assembled monolayer (SAM) on the top surface of the dummy layer;
   after the forming of the SAM, depositing a hard mask layer to wrap over the top channel member;
   removing the SAM and the dummy layer;
   removing the hard mask layer;
   after the removing of the hard mask layer, performing a thermal drive-in process to drive a dipole dopant species from the dipole layer into the gate dielectric layer around the bottom channel member; and
   removing the dipole layer.

2. The method of claim 1, further comprising:
   forming a first gate electrode to wrap around the bottom channel member;
   depositing an insulation layer over the first gate electrode; and
   forming a second gate electrode to wrap around the top channel member.

3. The method of claim 1,
   wherein the SAM is selectively formed on the dummy layer without forming on the gate dielectric layer, and
   wherein the hard mask layer is selectively formed on the gate dielectric layer without forming on the SAM.

4. The method of claim 1,
   wherein the SAM comprises a molecule that has a head group and a tail group,
   wherein the head group comprises a stronger affinity to a bond between a hydroxyl group and silicon than to a bond between a hydroxyl group and metal.

5. The method of claim 4, wherein the head group comprises a silane moiety, a phosphonate moiety, a carboxylate moiety, a catechol moiety, an alkyne moiety, an alkene moiety, or an amine moiety.

6. The method of claim 4, wherein the tail group comprises an alkyl group.

7. The method of claim 6, wherein a number of carbon atoms in the alkyl group is between 1 and 10.

8. The method of claim 1,
   wherein the gate dielectric layer comprises hafnium oxide,
   wherein the dummy layer comprises silicon, oxygen and carbon.

9. The method of claim 1, wherein the dipole layer comprises lanthanum oxide, zirconium oxide, or aluminum oxide.

10. The method of claim 1, wherein the hard mask layer comprises titanium nitride or titanium oxide.

11. A method, comprising:
   forming a workpiece comprising:
      a base fin,
      a bottom channel layer,
      a middle member over the bottom channel layer, the middle member comprising a middle dielectric layer sandwiched between and in contact with two middle channel layers, and
      a top channel layer over the middle member;
   forming a gate dielectric layer to wrap around the bottom channel layer, the middle member and the top channel layer;
   depositing a dipole layer over the gate dielectric layer to wrap around the bottom channel layer, the middle member and the top channel layer;
   after the depositing of the dipole layer, depositing a dummy layer over the workpiece;
   etching back the dummy layer such that the top channel layer and a portion of the middle member rise above a top surface of the dummy layer;
   after the etching back, removing a portion of the dipole layer over a top surface and sidewalls of the top channel layer to expose the gate dielectric layer around the top channel layer;
   selectively forming a self-assembled monolayer (SAM) on the top surface of the dummy layer;
   after the selectively forming, selectively depositing a hard mask layer to wrap over the top channel layer;
   removing the dummy layer and the SAM;
   removing the hard mask layer;
   after the removing of the hard mask layer, performing a thermal drive-in process to drive a dipole dopant species from the dipole layer into the gate dielectric layer around the bottom channel layer; and
   removing the dipole layer.

12. The method of claim 11, wherein the etching back comprises a dry etch process that uses hydrogen fluoride or ammonia.

13. The method of claim 11, wherein the removing of the portion of the dipole layer comprises a wet etch process that uses hydrochloric acid, ammonium hydroxide, hydrogen peroxide, or combinations thereof.

14. The method of claim 11, further comprising:
   before the selectively forming of the SAM, treating the dummy layer with oxygen plasma.

15. The method of claim 11, wherein, after the selectively depositing of the hard mask layer, a portion of the hard mask layer is sandwiched between the portion of the middle member and the SAM.

16. The method of claim 11, wherein the removing of the SAM comprises a dry etch process that uses oxygen plasma, hydrogen plasma, nitrogen plasma, or a combination thereof.

17. The method of claim 11, further comprising:

before the forming of the gate dielectric layer, forming an interfacial layer on exposed surfaces of the base fin, the bottom channel layer, the two middle channel layers, and the top channel layer.

18. A method, comprising:

forming an interfacial layer on surfaces of a bottom channel member and a top channel member that is disposed over the bottom channel member;

forming a gate dielectric layer over the interfacial layer to wrap around the bottom channel member and the top channel member;

depositing a dipole layer over the gate dielectric layer to wrap around the bottom channel member and the top channel member;

depositing a dummy layer over the dipole layer;

etching back the dummy layer such that the top channel member rises above a top surface of the dummy layer;

removing the dipole layer around the top channel member to expose the gate dielectric layer around the top channel member;

treating a top surface of the dummy layer with oxygen plasma;

passivating the top surface of the dummy layer with a self-assembled monolayer (SAM);

after the passivating, depositing a hard mask layer to wrap over the top channel member while the hard mask layer is not deposited on the SAM;

removing the SAM and the dummy layer;

removing the hard mask layer;

after the removing of the hard mask layer, performing a thermal drive-in process to drive a dipole dopant species from the dipole layer into the gate dielectric layer and the interfacial layer around the bottom channel member; and removing the dipole layer.

19. The method of claim 18, wherein the passivating comprises a number of process cycles, wherein each of the number of process cycles comprises:
depositing the SAM on the top surface of the dummy layer, and
flushing the top surface of the dummy layer with deionized (DI) water.

20. The method of claim 18, wherein the SAM comprises a molecule that has a head group and a tail group, wherein the head group comprises a silane moiety, a phosphonate moiety, a carboxylate moiety, a catechol moiety, an alkyne moiety, an alkene moiety, or an amine moiety, wherein the tail group comprises an alkyl chain with a number of carbon atoms between 1 and 10.

* * * * *